(12) United States Patent
Nakamura

(10) Patent No.: US 12,016,228 B2
(45) Date of Patent: Jun. 18, 2024

(54) DISPLAY DEVICE AND DISPLAY DEVICE PRODUCTION METHOD

(71) Applicant: SHARP KABUSHIKI KAISHA, Sakai (JP)

(72) Inventor: Tomoki Nakamura, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 755 days.

(21) Appl. No.: 17/279,587

(22) PCT Filed: Sep. 28, 2018

(86) PCT No.: PCT/JP2018/036381
§ 371 (c)(1),
(2) Date: Mar. 25, 2021

(87) PCT Pub. No.: WO2020/065945
PCT Pub. Date: Apr. 2, 2020

(65) Prior Publication Data
US 2021/0343827 A1  Nov. 4, 2021

(51) Int. Cl.
*H10K 59/18* (2023.01)
*H01L 25/00* (2006.01)
(Continued)

(52) U.S. Cl.
CPC .............. *H10K 59/18* (2023.02); *H01L 25/50* (2013.01); *H10K 59/131* (2023.02);
(Continued)

(58) Field of Classification Search
CPC .... H10K 59/18; H10K 59/131; H10K 77/111; H01L 25/50
See application file for complete search history.

(56) References Cited

U.S. PATENT DOCUMENTS

| 2010/0177018 A1 | 7/2010 | Wang et al. | |
| 2016/0044751 A1* | 2/2016 | Ikeda | H10K 59/18 362/227 |

(Continued)

FOREIGN PATENT DOCUMENTS

| JP | 2009282432 A | 12/2009 |
| JP | 2010160489 A | 7/2010 |

(Continued)

*Primary Examiner* — Kevin M Nguyen
(74) *Attorney, Agent, or Firm* — ScienBiziP, P.C.

(57) ABSTRACT

A display device including: a plurality of display bodies, wherein each of the plurality of display bodies includes a display region, a frame region surrounding the display region, and a terminal region in the frame region, a surface formed with the terminal region is a first face, the plurality of display bodies include a first display body and a second display body, either one of a first notched frame region provided with a first notched portion in the frame region of the first display body and a second notched frame region provided with a second notched portion in the frame region of the second display body is folded back to form a bonding portion by the first face of the first notched frame region and the first face of the second notched frame region, and the first notched portion and the second notched portion form a through-hole.

20 Claims, 26 Drawing Sheets

(51) Int. Cl.
*H10K 59/131* (2023.01)
*H10K 77/10* (2023.01)
*H01L 23/00* (2006.01)
*H10K 102/00* (2023.01)

(52) U.S. Cl.
CPC ............ *H10K 77/111* (2023.02); *H01L 24/32* (2013.01); *H01L 2224/32145* (2013.01); *H10K 2102/311* (2023.02)

(56) References Cited

U.S. PATENT DOCUMENTS

| | | |
|---|---|---|
| 2016/0210103 A1 | 7/2016 | Yoshizumi et al. |
| 2018/0217800 A1 | 8/2018 | Yoshizumi et al. |
| 2018/0322848 A1* | 11/2018 | Wu .......................... G09G 5/00 |
| 2019/0163433 A1 | 5/2019 | Yoshizumi et al. |
| 2020/0034105 A1 | 1/2020 | Yoshizumi et al. |

FOREIGN PATENT DOCUMENTS

| | | | |
|---|---|---|---|
| JP | 2014103023 A | 6/2014 | |
| JP | 2016167049 A | 9/2016 | |

* cited by examiner (a)

(b)

(c)

(d)

(e)

DISPLAY DEVICE AND DISPLAY DEVICE PRODUCTION METHOD

TECHNICAL FIELD

The disclosure relates to a display device and a manufacturing method of a display device.

BACKGROUND ART

In recent years, various flat panel displays are being developed. Particularly, Electro Luminescence (EL) display devices and the like, such as organic EL display devices including Organic Light-Emitting Diodes (OLEDs), and inorganic EL display devices including inorganic light-emitting diodes are receiving great attention because higher picture quality and low power consumption can be achieved.

However, in a case where a display device is manufactured by a method including a step where a high-definition vapor deposition film is formed in a vacuum by use of a vapor deposition mask, it is difficult to form a uniform, high-definition vapor deposition film on a large mother substrate, which makes it difficult to get large-sized display devices and manufacture such display devices at a low cost.

PTL 1 describes an electronic device with the display size enlarged by coupling together a plurality of display modules using a plurality of Flexible Printed Circuit Boards (FPCB).

PTL 2 discloses a configuration where red-color display panel, green-color display panel, and a blue-color display panel are connected commonly to a single printed flexible circuit board. PTL 2 claims that such a configuration can reduce the number of flexible printed circuit boards to be used.

PTL 3 discloses a cylindrical display device formed by curling a flexible display panel.

PTL 4 discloses a connection structure of organic EL panels emitting light of different colors, and claims that the use of the connection structure helps prevent miswiring.

CITATION LIST

Patent Literature

PTL 1: JP 2010-160489 A (published on Jul. 22, 2010)
PTL 2: JP 2009-282432 A (published on Dec. 3, 2009)
PTL 3: JP 2016-167049 A1 (published on Sep. 15, 2016)
PTL 4: JP 2014-103023 A (published on Jun. 5, 2014)

SUMMARY

Technical Problem

There is a demand for a technique for providing, in a display region of a display device, a through-hole for disposing other electronic devices and the like.

Solution to Problem

In order to solve the above-described problem, a display device according to an aspect of the disclosure is a display device including: a plurality of display bodies coupled together in a manner that display surfaces of display regions of the plurality of display bodies face the same direction, wherein each of the plurality of display bodies includes the display region, a frame region surrounding the display region, and a terminal region in the frame region, a surface formed with the terminal region is a first face, the plurality of display bodies include a first display body and a second display body, the display region of the first display body is provided with a first notched portion, either one of a first notched frame region provided with the first notched portion in the frame region of the first display body and a second notched frame region provided with a second notched portion in the frame region of the second display body is folded back to form a bonding portion by the first face of the first notched frame region and the first face of the second notched frame region, and the first notched portion and the second notched portion form a through-hole of the display device.

In order to solve the above problem, a manufacturing method of a display device according to an aspect of the disclosure is a manufacturing method of a display device including a plurality of display bodies coupled together in a manner that display surfaces of display regions of the plurality of display bodies face the same direction, each of the plurality of display bodies including the display region, a frame region surrounding the display region, and a terminal region in the frame region, a surface formed with the terminal region being a first face, and the plurality of display bodies including a first display body and a second display body, the manufacturing method including: providing a first notched portion in the display region of the first display body; folding back either one of a first notched frame region provided with the first notched portion in the frame region of the first display body and a second notched frame region provided with the second notched portion in the frame region of the second display body to bond the first face of the first notched frame region and the first face of the second notched frame region together; and forming the first notched portion and the second notched portion to be a through-hole of the display device.

Advantageous Effects of Disclosure

According to the disclosure, a through-hole can be provided in a display region.

DESCRIPTION OF EMBODIMENTS

Figure 1:
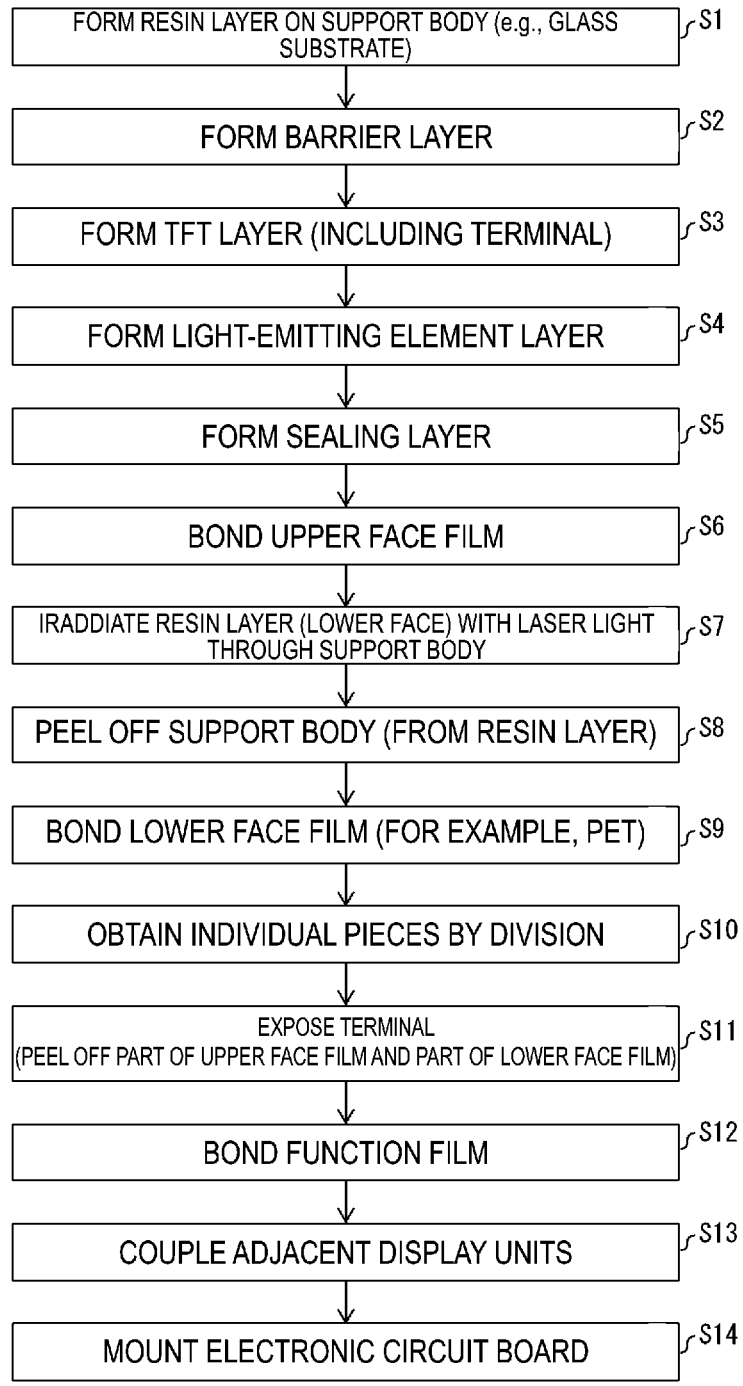
FIG. 1 is a flowchart illustrating an example of a manufacturing method of a display device according to some embodiments of the disclosure.
Figure 2:
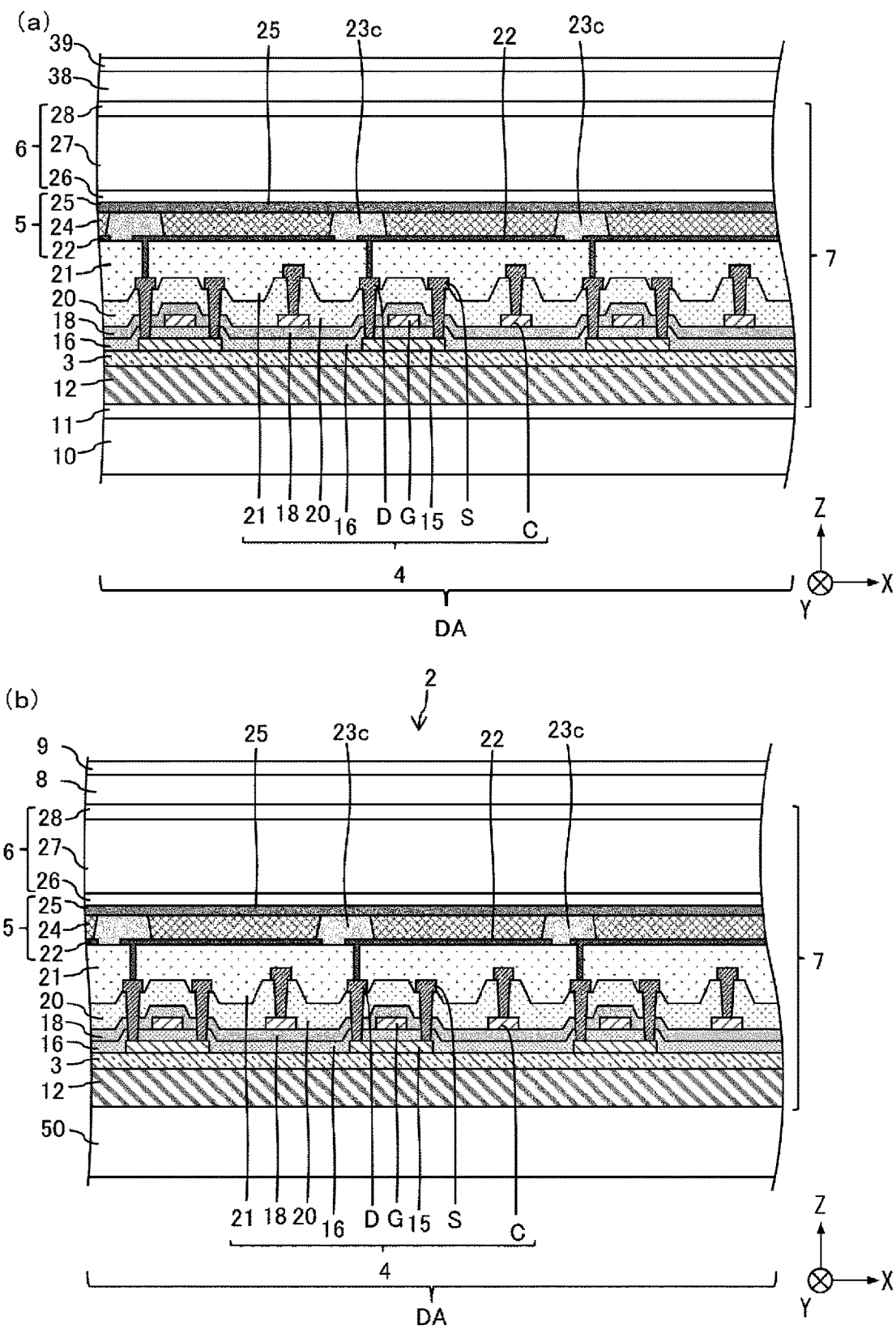
FIG. 2(a) is a cross-sectional view illustrating a configuration example of the display device (active area) according to some embodiments of the disclosure.
FIG. 2(b) is a cross-sectional view illustrating a configuration example of the display device (active area) at a stage in the manufacturing step according to some embodiments of the disclosure.

A description follows regarding embodiments of the disclosure, with reference to FIG. 1 to FIG. 25. Hereinafter, for convenience of descriptions, a configuration having the same functions as those of a configuration described in a specific embodiment are denoted by the same or similar reference numerals, and its descriptions may be omitted.

Note that, although in each of the embodiments described below, Flexible Printed Circuit Board (FPCB) is described as an example of circuit board, a non-flexible printed circuit board may be used in addition to the flexible printed circuit board.

In addition, the description of the following embodiments is based on a case where a flexible organic Electroluminescence (EL) panel is used as a display body. The embodiments, however, are not limited to such a case. a different flexible display panel from the organic EL display panel may be used, instead.

1. First Embodiment

Figure 3:
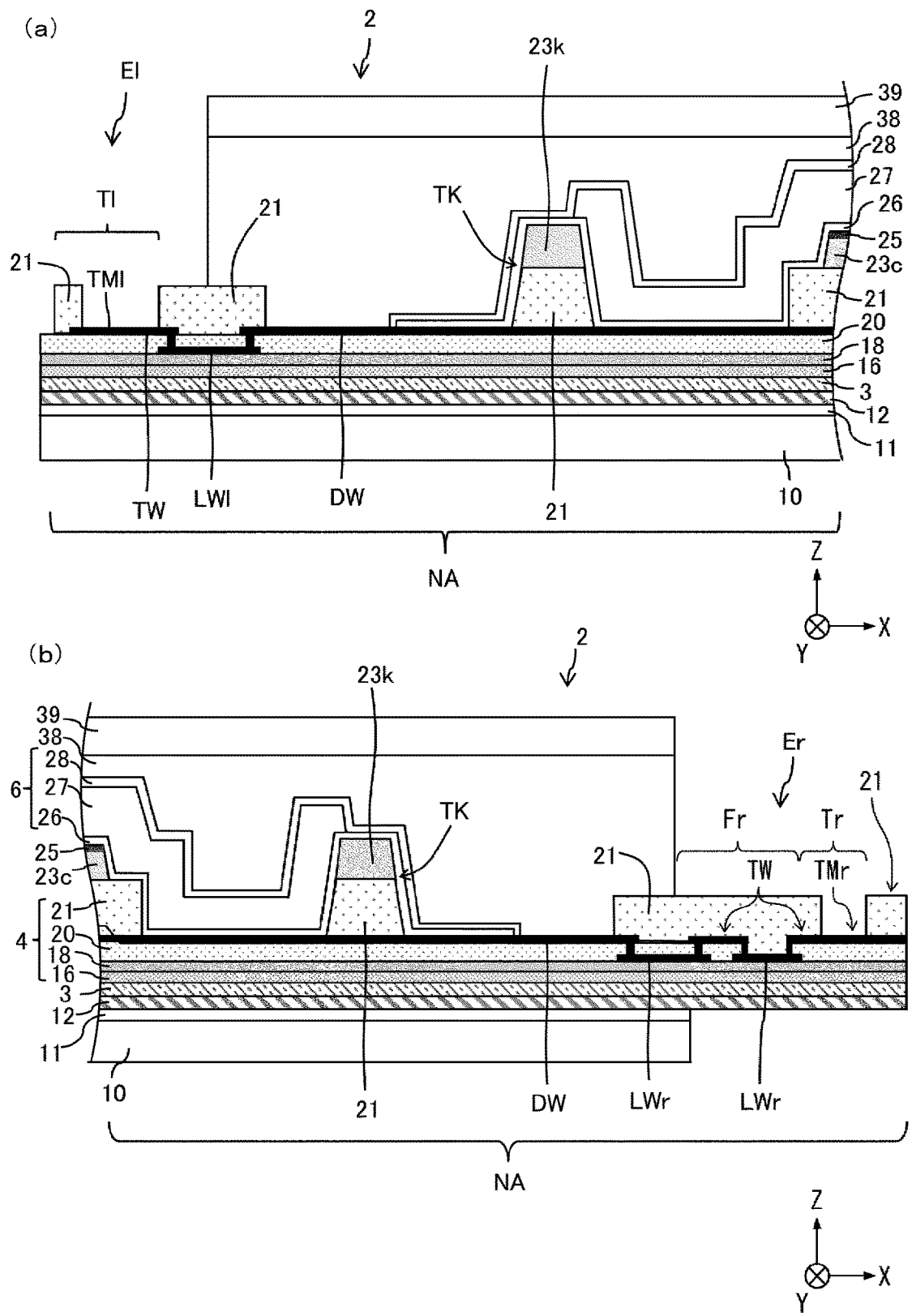
FIG. 3 is a cross-sectional view illustrating a configuration example of the display device (non-active area) according to some embodiments of the disclosure.
Figure 4:
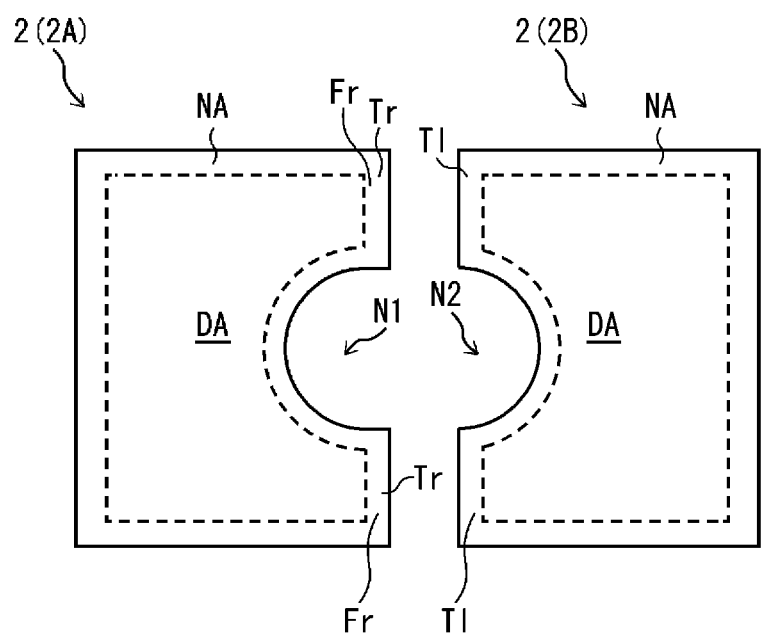
FIG. 4 is a top view illustrating a configuration example of the display unit before coupling according to an embodiment of the disclosure.

FIG. 1 is a flowchart illustrating a manufacturing method of a display device including a plurality of display units (flexible display bodies). FIG. 2(a) is a cross-sectional view illustrating a configuration example of a display unit (active area) of a first embodiment. FIG. 2(b) is a cross-sectional view illustrating a configuration example of the display unit (active area) of the first embodiment at a stage in the manufacturing step thereof. FIG. 3 is a cross-sectional view illustrating a configuration example of the display unit (non-active area) of the first embodiment. FIG. 4 is a top view illustrating a configuration example of the display unit before coupling.

As illustrated in FIG. 1 and FIG. 2(b), a resin layer 12 is formed on a transparent support body 50 (e.g., glass substrate) (step S1). Next, a barrier layer 3 is formed (step S2). Next, a TFT layer 4 is formed (step S3). Next, a light-emitting element layer (e.g., an OLED element layer) 5 is formed (step S4). Next, a sealing layer 6 is formed (step S5). Next, an upper face film 9 is bonded to the sealing layer 6 via an adhesive layer 8 therebetween (step S6).

Next, the lower face of the resin layer 12 is irradiated with a laser light through the support body 50 (step S7). Here, the resin layer 12 absorbs the laser light with which the lower face of the support body 50 has been irradiated and which has passed through the support body 50. As a result, the lower face of the resin layer 12 (i.e., the interface with the support body 50) is altered by abrasion, and the bonding force between the resin layer 12 and the support body 50 weakens. Next, the support body 50 is peeled off from the resin layer 12 (step S8).

Note that in the present embodiment, the resin layer 12 is provided with notched portions N1 and N2 that are cut out from the outer circumferential side toward the inner side of the resin layer 12. After the resin layer 12 is peeled from the support body by step S8, the notched portions N1 and N2 are formed, for example, by cutting or the like.

Next, a lower face film 10 (e.g., PET) is bonded to the lower face of the resin layer 12 via an adhesive layer 11 therebetween (step S9). Next, the resultant layered body with the lower face film attached is divided to obtain individual pieces (step S10). Next, an upper face film 9 on each of terminal portions Tl and Tr of the TFT layer 4 is peeled off to expose the terminals (step S11). Next, a function film 39 is bonded via an adhesive layer 38 (step S12). Thus obtained are individual pieces of the flexible display units 2 such as ones illustrated in FIG. 2(a) and FIG. 3. Next, the display units 2 adjacent to each other are coupled together (step S13). In the present embodiment, the notched portions N1 and N2 are provided between a plurality of bonding portion 80 that couple together the adjacent display units 2 while electrically bonding the adjacent display units 2.

Next, an electronic circuit board 45 is mounted on one of the left-hand-side terminal portions Tl of the TFT layer 4 of the display unit 2, that one being not connected to the right-hand-side terminal portion Tr of the adjacent display unit 2 (step S14). Note that each of the steps is performed by a manufacturing apparatus of a display device.

Examples of the material of the lower face film 10 include polyethylene terephthalate (PET). Examples of the material of the resin layer 12 include polyimide, epoxy, and polyamide.

The barrier layer 3 is a layer that inhibits moisture or impurities from reaching the TFT layer 4 or the light-emitting element layer 5 when the display device is being used, and can be constituted by a silicon oxide film, a silicon nitride film, or a silicon oxynitride film, or by a layered film of these, for example, formed using chemical vapor deposition (CVD). The thickness of the inorganic barrier layer 3 is, for example, from 50 nm to 1500 nm.

The TFT layer 4 includes: a semiconductor film 15; a gate insulating film 16 formed in an upper layer than the semiconductor film 15; a gate electrode G formed in an upper layer than the gate insulating film 16; passivation films 18 and 20 formed in an upper layer than the gate electrode G; a capacitance electrode B and the terminals TMl and TMr formed in an upper layer than the passivation film 18; a source wiring line S and a drain wiring line D formed in an upper layer than the passivation film 20; and an organic interlayer film (flattening film) 21 formed in an upper layer than the source wiring line S and the drain wiring line D. A thin film transistor (TFT) including the semiconductor film 15, the gate insulating film 16, and the gate electrode G is configured. In an end portion of the TFT layer 4, a plurality of terminals TMl and TMr used for connection with the electronic circuit board are formed.

The semiconductor film 15 is formed of low-temperature polysilicon (LTPS) or an oxide semiconductor, for example. It is allowable to form both a semiconductor film 15 formed of a low-temperature polysilicon and a semiconductor film 15 formed of an oxide semiconductor. The gate insulating film 16 may be configured by a silicon oxide (SiOx) film or a silicon nitride (SiNx) film, or a layered film thereof, formed using CVD, for example. The gate electrode G, the source electrode S, the drain electrode D, and the terminals are formed of a metal single layer film or a layered film including, for example, at least one of aluminum (Al), tungsten (W), molybdenum (Mo), tantalum (Ta), chromium (Cr), titanium (Ti), and copper (Cu). Note that, although the TFT including the semiconductor film 15 as a channel is illustrated as having a top gate structure in FIG. 2, the TFT may have a bottom gate structure (when the TFT channel is an oxide semiconductor, for example).

Each of the inorganic insulating films 16, 18, and 20 can be formed of, for example, a silicon oxide (SiOx) film or a silicon nitride (SiNx) film, or a layered film of these, formed by using a CVD method.

The flattening film 21 may be formed of a coatable photosensitive organic material, such as a polyimide material or an acrylic material. The flattening film 21 of the active area (i.e., an area that overlaps the light-emitting element layer 5, or the display region) functions as an underlayer of the light-emitting element layer 5.

An anode electrode 22 is formed by, for example, the layering of Indium Tin Oxide (ITO) and an alloy containing Ag and has light reflectivity.

The light-emitting element layer 5 (e.g., an organic light-emitting diode layer) includes a first electrode 22 (e.g., anode electrode) formed in an upper layer than the flattening film 21; a bank 23c covering the edges of the first electrode 22; an electroluminescence (EL) layer 24 formed in an upper layer than the first electrode 22; and a second electrode 25 formed in an upper layer than the EL layer 24. The first electrode 22, the EL layer 24, and the second electrode 25 together form a light-emitting element (e.g., organic light-emitting diode).

In a non-active area NA (hereinafter, referred to as a frame region NA), a frame-shaped protruding body TK surrounding the display region DA is formed. The protruding body TK defines an edge of the organic sealing film 27 (e.g., an organic film formed by an ink-jet method). As illustrated in FIGS. 3(a) and 3(b), the protruding body TK includes a lower portion formed of the flattening film 21 and an upper portion formed of an organic insulating film 23k.

Note that, as illustrated in FIG. 4, in the present embodiment, the periphery of the notched portions N1 and N2 is surrounded by the frame region NA. Here, among the barrier layer 3, the TFT layer 4, the light-emitting element layer 5, and the sealing layer 6, at least the light-emitting element layer 5 and the sealing layer 6 are formed prior to the formation of the notched portions N1 and N2. Thus, even in a case where the notched portions N1 and N2 are formed in the resin layer 12, the end portion of the light-emitting element layer 5 is covered by the sealing layer 6 and sealing property can be ensured.

The bank 23c and the organic insulating film 23k can be formed in the same step. For example, a coatable photosensitive organic material, such as a polyimide and an acrylic material, is applied to the display region DA and the non-active area NA by an ink-jet method.

The EL layer 24 is formed in a region (subpixel region) surrounded by the bank 23c by a vapor deposition method or an ink-jet method. When the light-emitting element layer 5 is an organic light-emitting diode (OLED) layer, for example, the EL layer 24 is formed by layering a hole injection layer, a hole transport layer, a light-emitting layer, an electron transport layer, and an electron injection layer in this order from the lower layer side. Note that one or more EL layers 24 may be a common layer (shared by a plurality of pixels).

The first electrode (an anode electrode) 22 is configured by, for example, layering Indium Tin Oxide (ITO) and an alloy including silver (Ag) and has light reflectivity. The second electrode (e.g., a cathode electrode) 25 is a common electrode and may be formed of a transparent metal such as Indium Tin Oxide (ITO) or Indium Zinc Oxide (IZO).

When the light-emitting element layer 5 is an OLED layer, positive holes and electrons are recombined inside the EL layer 24 by a drive current between the anode electrode 22 and the cathode electrode 25. The recombination generates excitons, and light is emitted when the excitons fall into a ground state.

The light-emitting element layer 5 is not limited to the OLED layer and may be an inorganic light-emitting diode layer or a quantum dot light-emitting diode layer.

The sealing layer 6 includes: a first inorganic sealing film 26 that covers the bank 23c and the cathode electrode 25; the organic sealing film 27 that is formed in an upper layer than the first inorganic sealing film 26; and a second inorganic sealing film 28 that covers the organic sealing film 27.

Each of the first inorganic sealing film 26 and the second inorganic sealing film 28 may be made of, for example, a silicon oxide film, a silicon nitride film or a silicon oxynitride film, or a layered film thereof, formed by CVD using a mask. The organic sealing film 27 is a transparent organic insulating film that is thicker than the first inorganic sealing film 26 and the second inorganic sealing film 28, and may be formed of a coatable photosensitive organic material such as polyimide or acryl. For example, after the first inorganic sealing film 26 is coated, by an ink-jet method, with an ink containing such an organic material, the ink is cured by ultraviolet (UV) irradiation. The sealing layer 6 (especially the first inorganic sealing film 26 and the second inorganic sealing film 28) covers the light-emitting element layer 5 and inhibits foreign matter, such as water and oxygen, from infiltrating to the light-emitting element layer 5.

Note that the upper face film 9 is bonded to the sealing layer 6 with the adhesive layer 8 therebetween and functions as a supporting material when the support body 50 is peeled off. Examples of a material of the upper face film 9 include polyethylene terephthalate (PET).

After the support body 50 is peeled off, the lower face film 10 is attached to the lower face of the resin layer 12. Thus, the display device to be manufactured will have excellent flexibility. An exemplar material of the lower face film 10 is PET. The function film 39 has an optical compensation function, a touch sensor function, a protection function, or the like, for example.

As illustrated in FIG. 3, the display unit 2 includes the left-hand-side terminal portion Tl and the right-hand-side terminal portion Tr. The left-hand-side terminal portion Tl is located in a left-hand-side end portion El that is located on the left-hand side (i.e., on the −X side) of the display unit 2. A left-hand-side terminal TMl is formed on the upper face (i.e., display surface) of the left-hand-side end portion El. The right-hand-side terminal portion Tr is located in a right-hand-side end portion Er that is located on the right-hand side (i.e., +X side) of the display unit 2. A right-hand-side terminal TMr is formed on the upper face (i.e., display surface) of the right-hand-side end portion Er. Though not illustrated in FIG. 3, the display unit 2 may have an upper-side terminal portion Tu and a lower-side terminal portion Td. The upper-side terminal portion Tu is located in an upper-side end portion Eu that is located on the upper side (i.e., +Y side) of the display unit 2. An upper-side terminal TMu is formed on the upper face (i.e., display surface) of the upper-side end portion Eu. The lower-side terminal portion Td is located in a lower-side end portion Ed that is located on the lower side (i.e., −Y side) of the display unit 2. A lower-side terminal TMd is formed on the upper face (i.e., display surface) of the lower-side end portion Ed.

As illustrated in FIG. 3(*a*), the terminal TMl of the left-hand-side terminal portion Tl is connected to a terminal wiring line TW. A lead-out wiring line DW is drawn out from the active area, and the terminal wiring line TW is connected to the lead-out wiring line DW via a relay wiring line LWl. End faces of the terminal TMl, the terminal wiring line TW, and the lead-out wiring line DW are covered with the flattening film 21.

As illustrated in FIG. 3(*b*), a flexible portion Fr is formed in the right-hand-side end portion Er, specifically between the terminal portion Tr and the display region DA. The lower face film 10 and the function film 39 (and preferably, at least one of the inorganic insulating films 16, 18, and 20) are partially removed from the flexible portion Fr. The terminal TMr of the right-hand-side terminal portion Tr is connected to the terminal wiring line TW. A lead-out wiring line DW is drawn out from the active area, and the terminal wiring line TW is connected to the lead-out wiring line DW via a relay wiring line LWr. End faces of the terminal TMl, the terminal wiring line TW, and the lead-out wiring line DW are covered with the flattening film 21.

The left-hand-side terminal TMl located on the left-hand side is connected eventually to the right-hand-side terminal TMr located on the right-hand side via: the terminal wiring line TW, the relay wiring line LWl, and the lead-out wiring line DW on the left-hand-side; wiling lines (i.e., first signal lines) in the active area, the wiring lines being the ones extending in a first direction from the left-hand side to the right-hand-side among the source wiring lines S (i.e., source signal lines) and the gate wiring lines (i.e., gate signal lines); and the lead-out wiring line DW, the relay wiring line LWr, and the terminal wiring line TW on the right-hand side.

On the left-hand-side terminal portion Tl of each display unit 2, the right-hand-side terminal portion Tr of a different, adjacent display unit 2 or an electronic circuit board (e.g., an IC chip and an electronic circuit board such as a flexible printed circuit board) is mounted.

On the right-hand-side terminal portion Tr of each display unit 2, the left-hand-side terminal portion Tl of a different, adjacent display unit 2 or an electronic circuit board (e.g., an IC chip and an electronic circuit board such as a flexible printed circuit board) is mounted. Alternatively, the right-hand-side terminal portion Tr of each display unit 2 may be cut off without anything to be mounted thereon.

1-1. Coupling Step

Figure 5:
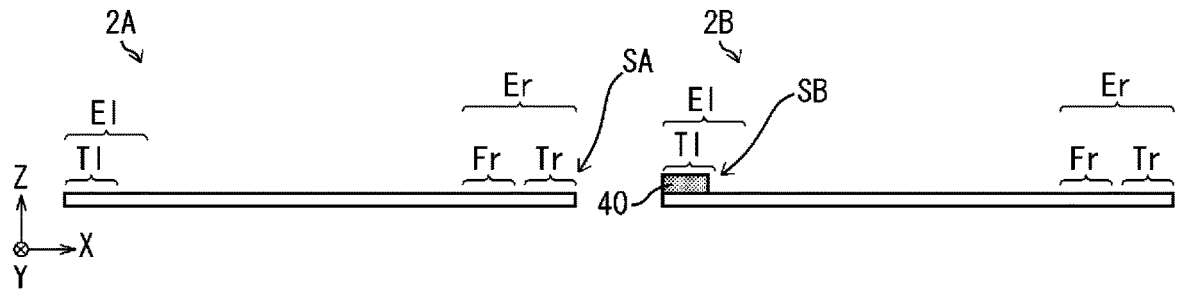
FIG. 5 is a cross-sectional view illustrating coupling step and mounting steps according to an embodiment of the disclosure.
Figure 5:
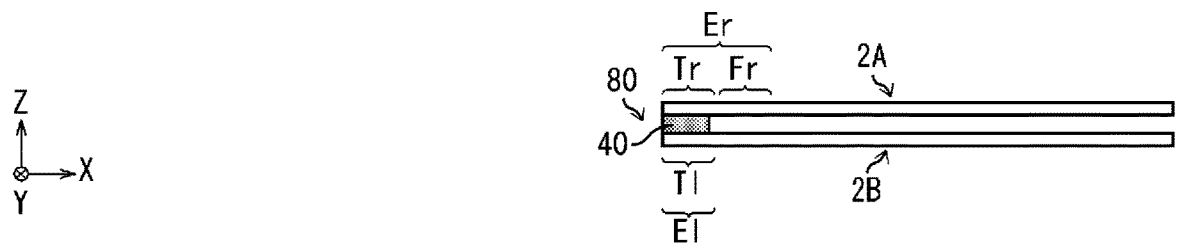
Figure 5:
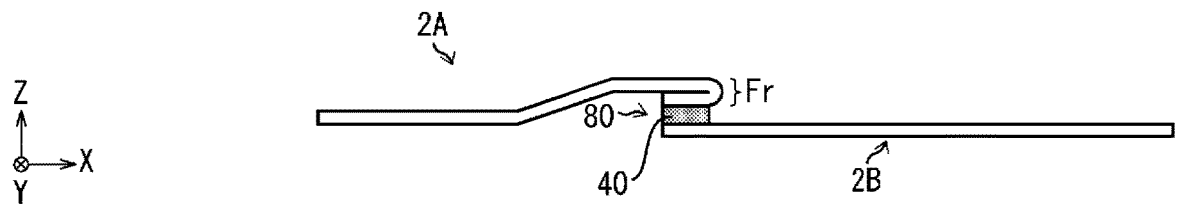
Figure 5:
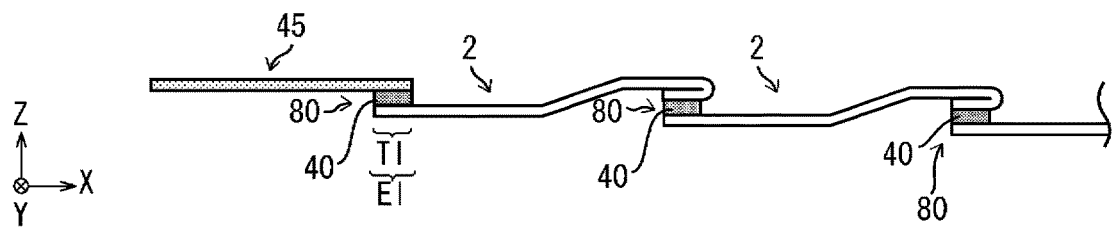
Figure 5:
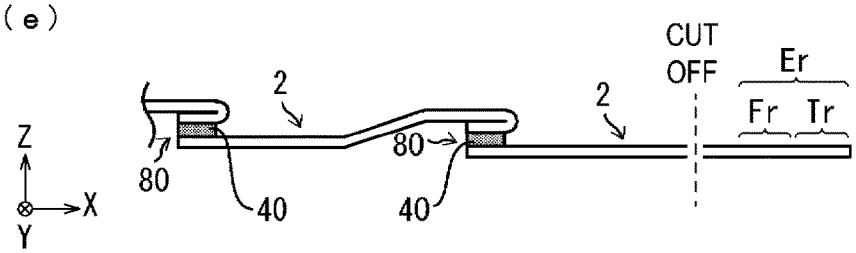
Figure 6:
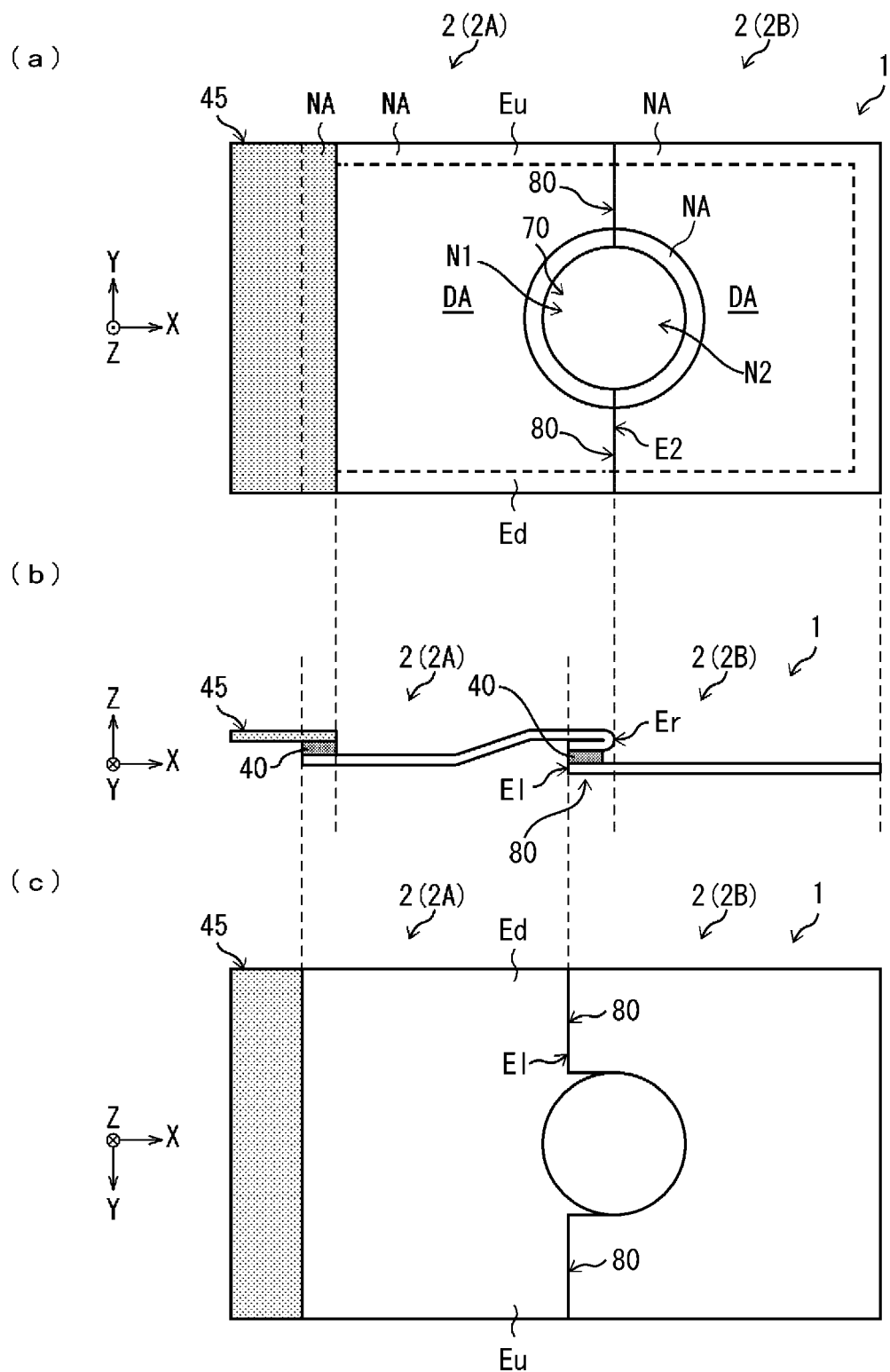
FIG. 6(a) is a plan view illustrating a configuration example of display device, seen from the display surface side, according to an embodiment of the disclosure.
FIG. 6(b) is a cross-sectional view of the configuration example.
FIG. 6(c) is a plan view of the configuration example seen from the opposite side to a display surface.

The following will describe the coupling step of the present embodiment. The coupling step is a step of electrically bonding the plurality of display units 2 while the plurality of display units 2 is coupled together. FIG. 5 is a cross-sectional view illustrating a coupling step (S13) and a mounting step (S14) according to the first embodiment. FIG. 6(*a*) is a plan view illustrating a configuration example of the display device 1, seen from the display surface side, according to the first embodiment, FIG. 6(*b*) is a cross-sectional view of the configuration example, and FIG. 6(*c*) is a plan view of the configuration example seen from the opposite side to the display surface.

Firstly, as illustrated in FIG. 4 and FIG. 5(*a*), a pair of display units 2 are arranged to be adjacent each other. For convenience sake, in FIG. 4 and FIGS. 5(*a*) to 5(*c*) and in the description provided with reference to these drawings, the display unit 2 illustrated on the left-hand side of FIG. 4 and FIG. 5(*a*) is referred to as a display unit "2A" (a first display body), whereas the display unit 2 illustrated on the right-hand side of FIG. 4 and FIG. 5(*a*) is referred to as a display unit "2B" (a second display body). The pair of display units 2A and 2B may be identical display units 2 or may not be identical display units 2.

As illustrated in FIG. 4, the display units 2A and 2B according to the present embodiment include notched portions N1 and N2 that are cut out from the outer circumferential side toward the inner side. A frame region NA is formed on the periphery of the notched portions N1 and N2. The first notched portion N1 of the display unit 2A is formed between the two terminal portions Tr in the right-hand-side end portions Er. The second notched portion N2 of the display unit 2B is formed between the two left terminal portions Tl. Note that in the example of FIG. 4, the notched portions N1 and N2 are formed in both the display units 2A and 2B. However, the notched portions N1 and N2 may be formed in either one of the display unit 2A and the display unit 2B.

Subsequently, an anisotropic conductive film 40 is bonded to the display surface of the terminal portion Tl located in the left-hand-side end portion El of the display unit 2B (sub step of a first bonding step). Alternatively, an anisotropic conductive film 40 may be bonded to the terminal portion Tr located in the right-hand-side end portion Er of the display unit 2A.

Then, as illustrated in FIG. 5(b), the display unit 2A is overlapped on the display unit 2B (specifically, on the display surface of the display unit 2B) to allow: (i) the display surfaces of the display units 2A and 2B to face each other; and (ii) the right-hand-side terminal portion Tr of the display unit 2A to be overlapped on the left-hand-side terminal portion Tl of the display unit 2B. Alternatively, the display unit 2B may be overlapped on the display unit 2A (specifically, on the display surface of the display unit 2A). Hence, the display surface of the right-hand-side terminal portion Tr of the display unit 2A and the display surface of the left-hand-side terminal portion Tl of the display unit 2B face each other with the anisotropic conductive film 40 provided in between.

Then, the terminal portion Tr of the display unit 2A and the terminal portion Tl of the display unit 2B are subjected to heat and pressure. As a result, the terminal portion Tr of the display unit 2A and the terminal portion Tl of the display unit 2B are bonded together by means of the anisotropic conductive film 40 (sub step of the first bonding step). At the same time, the right-hand-side terminal TMr formed on the display surface of the terminal portion Tr of the display unit 2A is connected, via the anisotropic conductive film 40, to the left-hand-side terminal TMl formed on the display surface of the terminal portion Tl of the display unit 2B.

Subsequently, as illustrated in FIG. 5(c), the right-hand-side end portion Er of the display unit 2A is bent at the flexible portion Fr located in the right-hand-side end portion Er of the display unit 2A by approximately 180 degrees towards the opposite side of the display surface (first bending step). Thus, the terminal portion Tr of the display unit 2A and the terminal portion Tl of the display unit 2B that have been bonded together are hidden behind the display unit 2A from the view from the display surface side.

Hence, the gaps (i.e., breaks of displayed images) between adjacent display units 2 can be reduced, or preferably can be eliminated. In addition, the display surface of the display unit 2A and the display surface of the display unit 2B can be substantially flush with each other. The thickness of the display unit 2A and the thickness of the anisotropic conductive film 40 after the bonding are typically very thin (e.g., approximately 300 µm and approximately 100 µm, respectively). Hence, the level difference in the bonding portion between the display surface of the display unit 2A and the display surface of the display unit 2B is typically very small (e.g., smaller than 1 mm), and consequently does not usually affect the display of the display device 1.

By performing the above-described coupling operation, two or more display units 2 can be coupled together. Note that, as illustrated in the example of FIG. 5, by repeating the above-described coupling operation, three or more display units 2 can be coupled together. By coupling together the display unit 2A and the display unit 2B, the notched portions N1 and N2 of the display unit 2A and the display unit 2B form the through-hole 70. Details of the through-hole 70 will be described later.

As illustrated in FIG. 5(d), in a case where the left-hand-side end portion El of a particular display unit 2 is not bonded to the right-hand-side end portion Er of a different display unit 2, an electronic circuit board 45 (first circuit board) may be mounted on the left-hand-side end portion El of the particular display unit 2 to allow the left-hand-side terminals TMl of the left-hand-side end portion El to be electrically connected to the input/output terminals of the electronic circuit board 45 (first circuit board mounting step). Though not illustrated, in a case where the right-hand-side end portion Er of a particular display unit 2 is not bonded to the left-hand-side end portion El of a different display unit 2, an electronic circuit board 45 (second circuit board) may be mounted on the right-hand-side end portion Er of the particular display unit 2 to allow the right-hand-side terminal TMr of the right-hand-side end portion Er to be electrically connected to the input/output terminals of the electronic circuit board 45 (second circuit board mounting step).

In this way, the electronic circuit board 45 can be mounted on the left-hand-side end portion El and/or the right-hand-side end portion Er. Hence, all the display units 2 can omit the drive circuit configured to drive the source wiring lines S or the gate wiring lines. Accordingly, all the display unit 2 may have identical configurations. In addition, a gate drive circuit configured to drive the gate wiring lines may be provided in the display region DA of each display unit 2. In this case, the first signal lines may be wiring lines configured to supply signals to the gate drive circuit, and the electronic circuit board 45 may be provided with a wiring line to supply signals to the gate drive circuit. The details of the gate drive circuit will be described later.

As illustrated in FIG. 5(e), in a case where the right-hand-side end portion Er of a particular display unit 2 is not bonded to the left-hand-side end portion El of a different display unit 2, the right-hand-side end portion Er of the particular display unit 2 may be cut off (first cut-off step). In this way, if the end portion is not necessary, such an end portion can be cut off. Hence, each one of the display units 2 can be provided with a left-hand-side terminal portion Tl in its left-hand-side end portion El and a right-hand-side terminal portion Tr in its right-hand-side end portion Er. Accordingly, all the display unit 2 may have identical configurations.

Thus, the manufacturing method of the display device according to the present embodiment includes a step of forming the notched portions N1 and N2 on at least one of a first base material (resin layer 12) of the display unit 2A or a second base material (resin layer 12) of the display unit 2B. The manufacturing method of the display device according to the present embodiment further includes a step of forming, on each of the first base material and the second base material, a display unit 2A and a display unit 2B including an active area (hereinafter, referred to as the display region DA) including a display surface and a frame region NA surrounding the display region DA. The manufacturing method of the display device according to the present embodiment includes a step of coupling together the display unit 2A and the display unit 2B.

The manufacturing method of the display device according to the present embodiment includes a step of forming a terminal region where a first terminal portion Tr is provided in the frame region NA of the display unit 2A and a terminal region where a second terminal portion Tl is provided in the frame region NA of the display unit 2B. The manufacturing method includes a step of forming a plurality of bonding portions 80 where the first terminal portion Tr and the second terminal portion Tl are electrically connected to each other, and the notched portions N1 and N2 form, between the plurality of bonding portions 80, a through-hole 70 sandwiched between the display unit 2A and the display unit 2B. Accordingly, the through-hole 70 can be provided in the display region.

The step of forming the through-hole 70 in the display region is complex and has a large burden on the step. This is because, for example, it is difficult to prepare a mask to prevent adhesion of a film such as the light-emitting element layer 5 and the sealing layer 6 in the location where the through-hole 70 is formed. By contrast, the manufacturing method of the present embodiment can easily form the through-hole 70 in the display region DA without using the mask. Accordingly, the burden on the step of forming the through-hole 70 in the display region DA can be reduced.

The manufacturing method of the present embodiment can suppress physical and chemical effects on the light-emitting element layer 5 and the sealing layer 6 when forming the through-hole 70. In other words, the through-hole 70 can be formed in the display region DA while suppressing damage to the light-emitting element layer 5 and the sealing layer 6. As a result, the through-hole 70 can be provided in the display region DA while suppressing a decrease in reliability of each of display units 2.

1-2. Display Device

As illustrated in FIG. 6, the display device 1 according to the present embodiment includes a display unit 2A, a display unit 2B, a plurality of bonding portions 80, and a through-hole 70. As illustrated in FIG. 6, the display device 1 according to the present embodiment is a display device including a plurality of display bodies (the display unit 2A and the display unit 2B) coupled together to allow display regions DA to face the same direction. The display device 1 is used in an electronic device including, for example, a mobile terminal such as a smartphone, a game console, or the like.

The display unit 2A and the display unit 2B, which constitute the plurality of display bodies, include a display region DA including a display surface and a frame region NA surrounding the display region DA. The display unit 2A includes a terminal region where the first terminal portion Tr is provided in the frame region NA. The display unit 2B includes a terminal region where the second terminal portion Tl is provided in the frame region NA.

The bonding portion 80 electrically bonds the display unit 2A and the display unit 2B while coupling together the display unit 2A and the display unit 2B. In the bonding portion 80, the first terminal portion Tr and the second terminal portion Tl are electrically connected to each other. Note that in the bonding portion 80 of the present embodiment, the first terminal portion Tr and the second terminal portion Tl are adhered to each other via the anisotropic conductive film 40. Accordingly, the generation of electrical connection failure between the first terminal portion Tr and the second terminal portion Tl can be reduced. Furthermore, the connection strength between the first terminal portion Tr and the second terminal portion Tl can be improved.

As illustrated in FIG. 5(a), a surface on which the first terminal portion Tr of the display unit 2A is formed is referred to as a first face SA, and a surface on which a second terminal portion Tl of the display unit 2B is formed is referred to as a first face SB. In the bonding portion 80, the first face SA of the display unit 2A and the first face SB of the display unit 2B are bonded together. At this time, either one of the frame region NA (first notched frame region) provided with the notched portion N (first notched portion N1) of the display unit 2A and the frame region NA (second notched frame region) provided with the notched portion (second notched portion N2) of the display unit 2B is folded back. Then, the first notched portion N1 and the second notched portion N2 form the through-hole 70.

Note that in the example of FIG. 6, in the bonding portion 80, the frame region NA (first notched frame region) of the first display unit 2A is folded back by approximately 180 degrees to form a plane surface. By contrast, in the bonding portion 80, the frame region NA (second notched frame region) of the display unit 2B may be folded back. The angle of the fold may be, for example, not less than 90 degrees, or may be less than 90 degrees.

In the example illustrated in FIG. 6, the display unit 2A and the display unit 2B include one first notched portion N1 and one second notched portion N2, respectively. In the bonding portion 80, the first face M1 of the frame region NA of the display unit 2A and the first face M1 of the frame region NA of the display unit 2B are bonded together in such a manner that the first notched portion N1 and the second notched portion N2 face each other. The first notched portion N1 and the second notched portion N2 form one through-hole 70. By contrast, the display unit 2A and the display unit 2B may include a plurality of first notched portions N1 and a plurality of second notched portions N2, respectively. The plurality of first notched portions N1 and the plurality of second notched portions N2 may form a plurality of through-holes 70.

The through-hole 70 is provided between the plurality of bonding portions 80 and in a position sandwiched between the display unit 2A and the display unit 2B. Note that in the example of FIG. 6, there are two bonding portions 80 and one through-hole 70. There may be three or more bonding portions 80 and two or more through-holes 70. In the example of FIG. 6, the through-hole 70 has a circular shape, but the through-hole 70 may have other shapes such as a rectangle. In the present embodiment, the periphery of the through-hole 70 is surrounded by the frame region NA. Thus, even in a case where the through-hole 70 is formed in the display region DA, the end portion of the light-emitting element layer 5 can be covered by the sealing layer 6. Thus, the sealing property of the light-emitting element layer 5 can be ensured.

In the example of FIG. 6, a plurality of mutually coupled display units 2 have their respective display surfaces that are substantially flush with one another. Hence, the plurality of display regions DA of the plurality of mutually coupled display unit 2 can be visually recognized as an integrated single display region that is included in the display device 1. In the case of respective pairs of adjacent display units 2, the display regions DA of such display units 2 are arranged to leave smaller gaps in between, and may be arranged preferably to leave as small gaps as to make the gaps visually unrecognizable. Hence, the breaks of displayed images between the active areas of the display device 1 are as small as, preferably unrecognizable visually.

Figure 7:
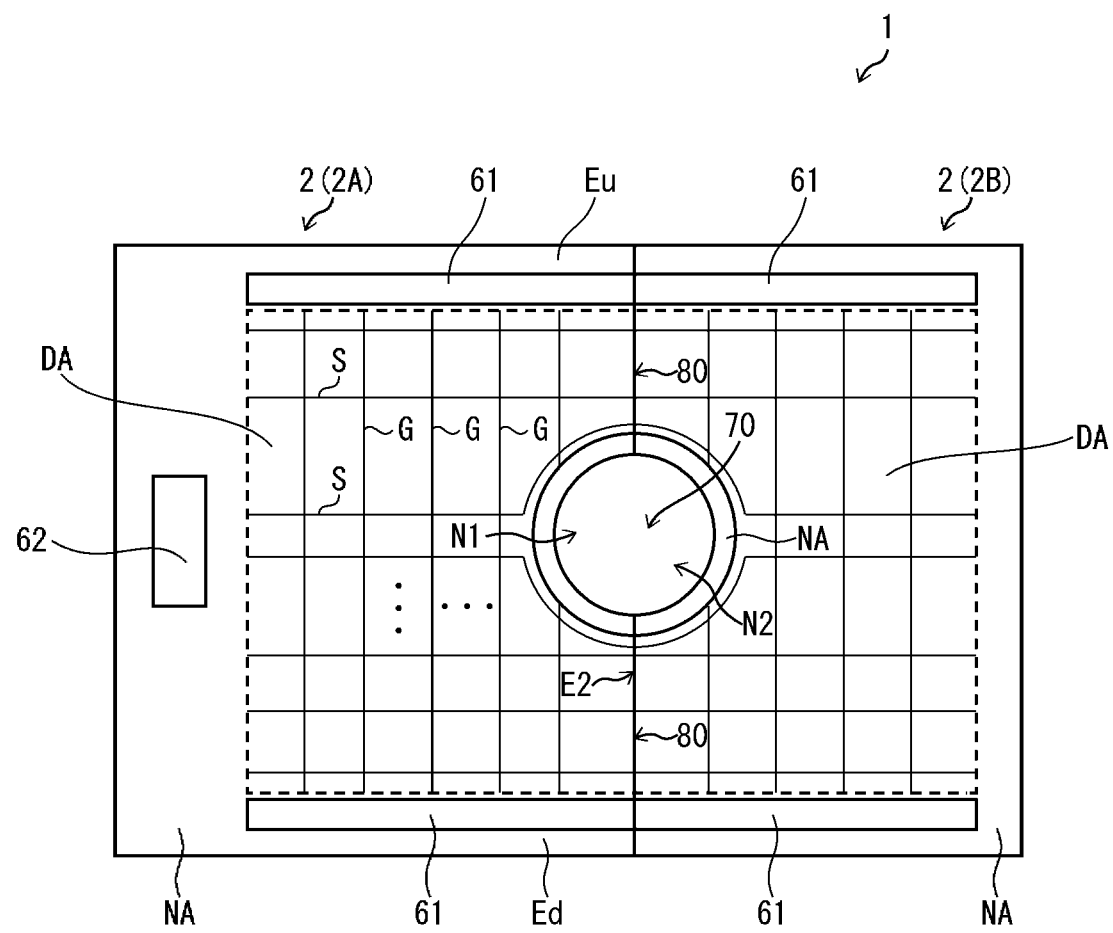
FIG. 7 is a top view illustrating a schematic configuration of drive circuits and signal lines of a display device according to an embodiment of the disclosure.

FIG. 7 is a top view illustrating a schematic configuration of drive circuits and signal lines of the display device 1 according to the present embodiment. The display device 1 according to the present embodiment includes a gate signal line (gate wiring line G), a source signal line (source wiring line S), a first drive circuit 61, and a second drive circuit 62. The gate wiring line G is provided on the display surface side of each of the display units 2 to extend in one direction (vertical direction in FIG. 7). The source wiring line S is provided in each of the display units 2 to extend in a direction intersecting the gate signal line G (horizontal direction in FIG. 7). Note that for convenience of explanation, in FIG. 7, only a part of each of a plurality of source wiring lines S and a plurality of gate wiring lines G is illustrated. However, a large number of the source wiring lines S and the gate wiring lines G are provided to be dense within the display regions DA.

The first drive circuit 61 supplies a signal supplied from the electronic circuit board 45 described above to the gate wiring line G. In the present embodiment, the first drive circuit 61 is disposed in each of the upper frame region NA and lower frame region NA in FIG. 7 of the display unit 2A and the display unit 2B. By providing the first drive circuit 61 in this manner, the gate wiring line G can be wired linearly without bypassing the through-hole 70. In other words, the first drive circuit 61 can supply signals from the upper and lower frame regions NA in FIG. 7 to the linearly wired gate wiring line G.

The second drive circuit 62 supplies the signal supplied from the electronic circuit board 45 described above to the source wiring line S. In the present embodiment, the second drive circuit 62 is provided in the frame region NA on the left side in FIG. 7 of the display unit 2A. The second drive circuit 62 supplies the signal to the source wiring line S from the left side in FIG. 7. The source wiring line S is wired to bypass the through-hole 70 disposed in the extending direction of the source wiring line S. In other words, the source wiring line S of the display unit 2A is wired to bypass the first notched portion N1. In the bonding portion 80, the source wiring line S of the display unit 2A and the source wiring line S of the display unit 2B are electrically bonded to each other. Furthermore, in the display unit 2B, the source wiring line S is wired to bypass the second notched portion N2, and is further wired toward the right side in FIG. 7.

Note that one first drive circuit 61 may be provided in each of the frame region NA of the display unit 2A and the frame region NA of the display unit 2B. The gate wiring line G may be wired to bypass the through-hole 70. The second drive circuit 62 may be provided in each of the frame region NA of the display unit 2A and the frame region NA of the display unit 2B. By providing the second drive circuit 62 in this way, the source wiring line G can be wired linearly without bypassing the through-hole 70.

In this way, in the bonding portion 80, the gate signal lines of the display unit 2A and the display unit 2B or the source signal lines of the display unit 2A and the display unit 2B are electrically connected to each other by the mutually connected first terminal portion Tr and the second terminal portion Tl. As a result, even in a case where the display unit 2A and the display unit 2B are coupled together with the through-hole 70 interposed therebetween, the display unit 2A and the display unit 2B can be electrically connected to each other. As a result, even in a case where the display unit 2A and the display unit 2B are coupled together with the through-hole 70 interposed therebetween, the display regions DA of the display unit 2A and the display region DA of the display unit 2B can be integrated.

1-3. Modification Example

The first embodiment of the disclosure has been described above, but the disclosure is not limited to the embodiment described above. Note that the following description of the modified examples will be given with reference to the points differing from the above-described first embodiment.

FIG. 8 to FIG. 11 are cross-sectional views illustrating various modified examples of the coupling step (S13) according to the first embodiment.

Figure 8:
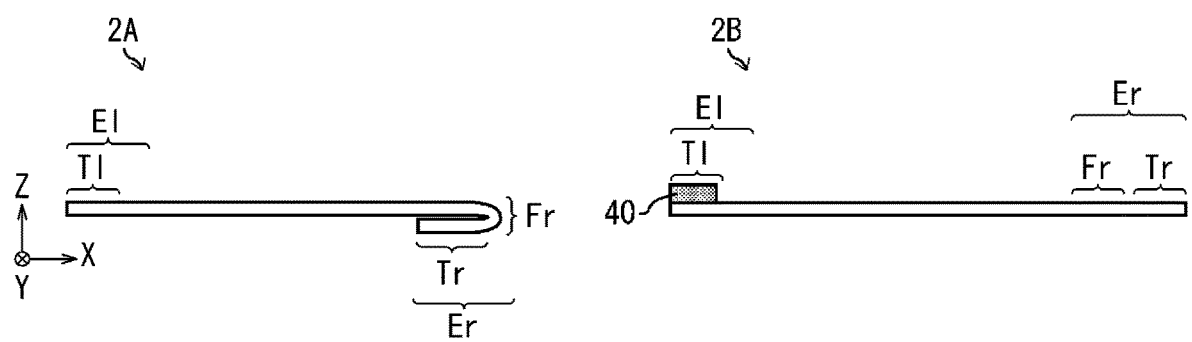
FIG. 8 is a cross-sectional view illustrating an example of various modified examples of the coupling step illustrated in FIG. 5.
Figure 9:
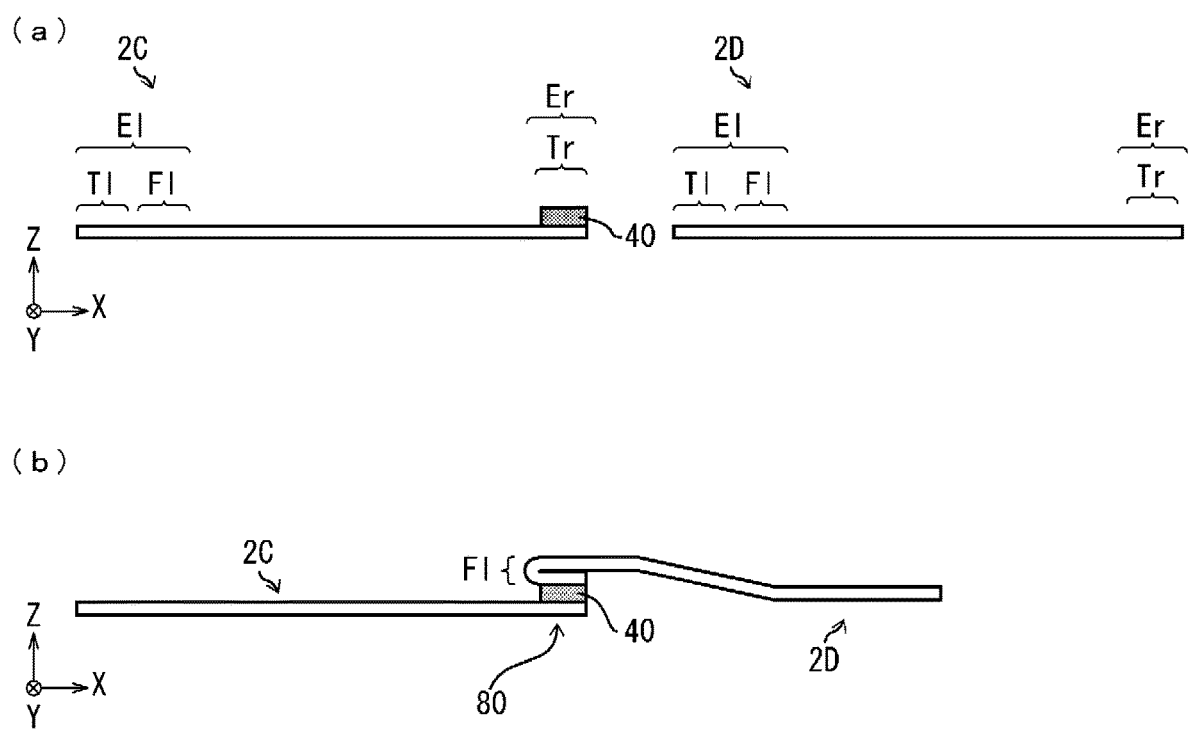
FIG. 9 is a cross-sectional view illustrating a different example of various modified examples of the coupling step illustrated in FIG. 5.
Figure 10:
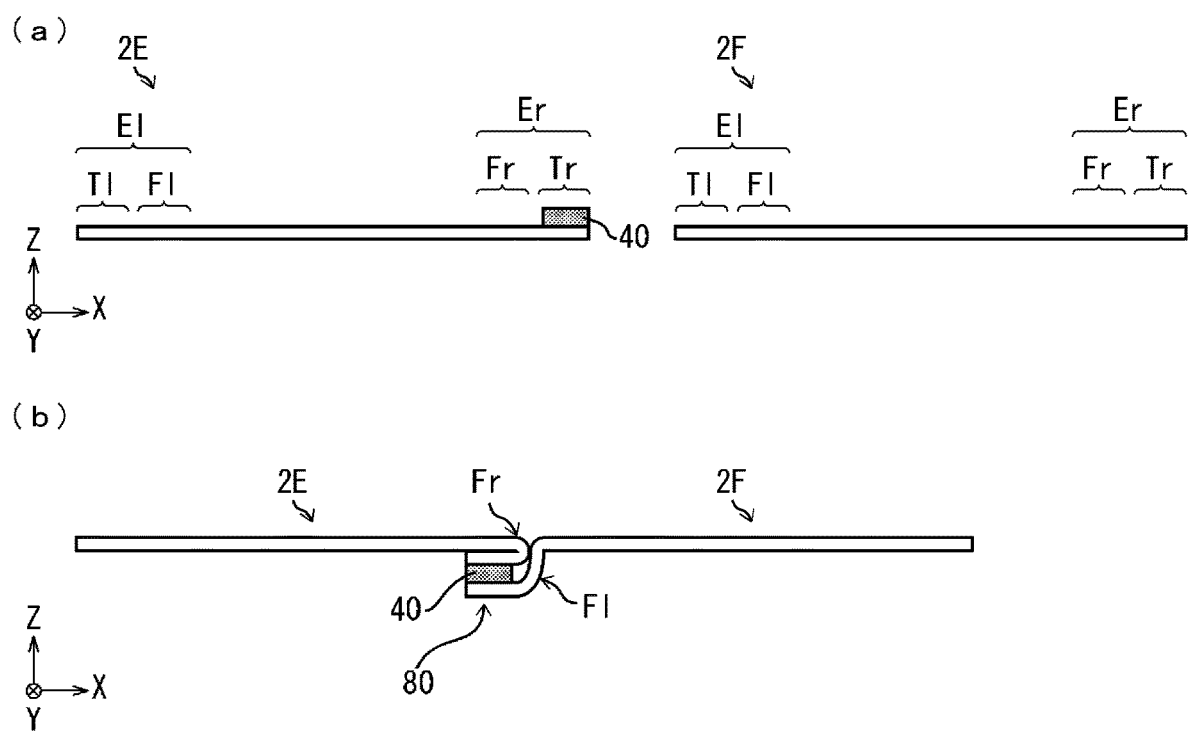
FIG. 10 is a cross-sectional view illustrating a different example of various modified examples of the coupling step illustrated in FIG. 5.
Figure 11:
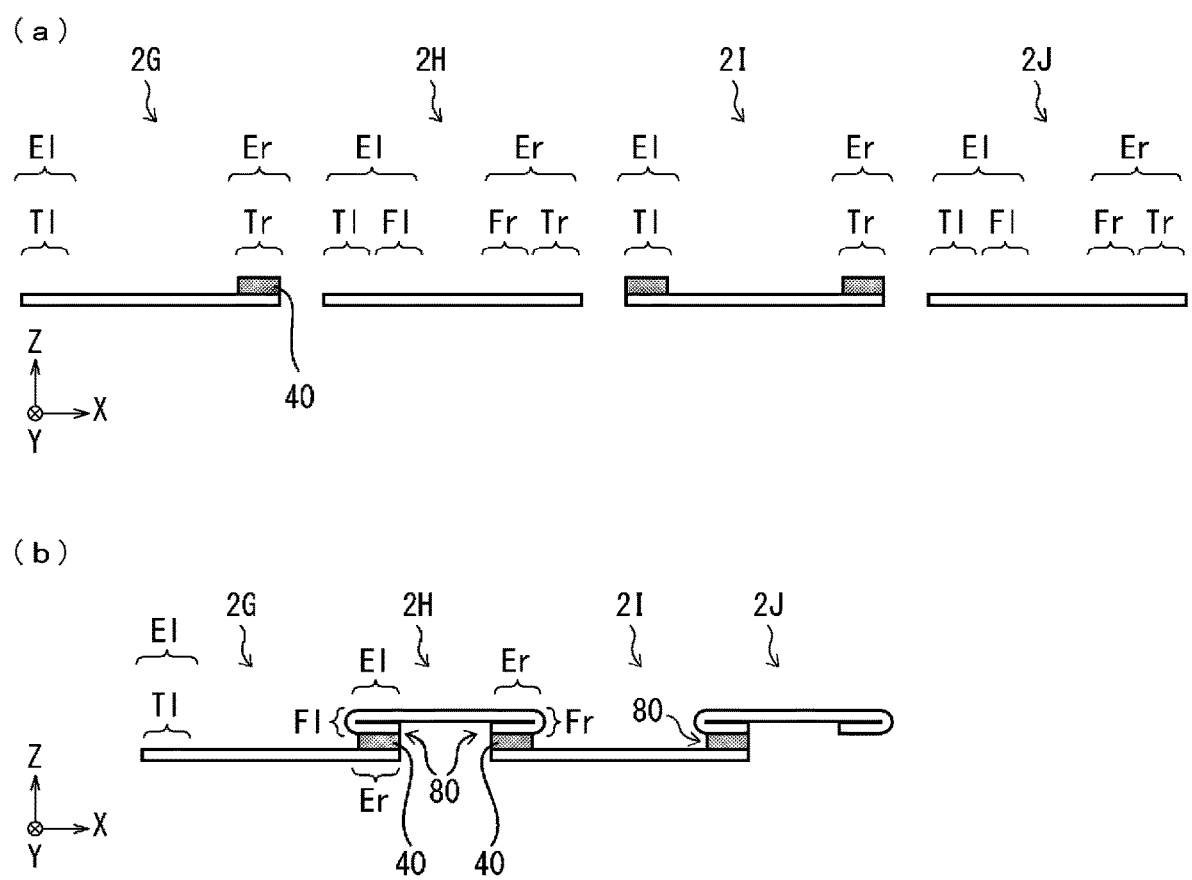
FIG. 11 is a cross-sectional view illustrating a different example of various modified examples of the coupling steps illustrated in FIG. 5.

For convenience sake, in FIG. 9 and in the description provided with reference to the drawing, the display unit 2 illustrated on the left-hand side of FIG. 9(a) is referred to as a display unit "2C," whereas the display unit 2 illustrated on the right-hand side of FIG. 9(a) is referred to as a display unit "2D." In FIG. 10 and in the description provided with reference to the drawing, the display unit 2 illustrated on the left-hand side of FIG. 10(a) is referred to as a display unit "2E," whereas the display unit 2 illustrated on the right-hand side of FIG. 10(a) is referred to as a display unit "2F." In FIG. 11 and in the description provided with reference to the drawing, the leftmost display unit 2 illustrated in FIG. 11(a) is referred to as a display unit "2G," the second leftmost display unit 2 illustrated in FIG. 11(a) is referred to as a display unit "2H," the second rightmost display unit 2 illustrated in FIG. 11(a) is referred to as a display unit "2I," and the rightmost display unit 2 illustrated in FIG. 11(a) is referred to as a display unit "2J." Note that in the examples illustrated in FIG. 8 to FIG. 11, the display device 1 may include, between the plurality of bonding portions 80, the through-hole 70 sandwiched between adjacent display units 2. The through-hole 70 is similar to the through-hole 70 of above-described first embodiment, and thus the description thereof will be omitted.

For example, as illustrated in FIG. 8, prior to the mutual bonding of the adjacent pair of display units 2A and 2B, the right-hand-side end portion Er of the display unit 2A may be bent at the flexible portion Fr located in the right-hand-side end portion Er of the display unit 2A by approximately 180 degrees towards the opposite side of the display surface. In this case, as illustrated in FIG. 5(c), the terminal portion Tr of the display unit 2A and the terminal portion Tl of the display unit 2B can be bonded together to allow the display surface of the terminal portion Tr and the display surface of the terminal portion Tl: (i) to face and overlap each other with the anisotropic conductive film 40 provided in between; and (ii) subsequently to be bonded together via the anisotropic conductive film 40. Note that from the workability's viewpoint, it is preferable, as illustrated in FIG. 5(b), to bond the right-hand-side end portion Er of the display unit 2A to the left-hand-side end portion El of the display unit 2B before the right-hand-side end portion Er of the display unit 2A is bent.

For example, a flexible portion Fl may be formed in the left-hand-side end portion El at a position between the terminal portion Tl and the display region DA as illustrated in FIG. 9(a), instead of forming the flexible portion Fr in the right-hand-side end portion Er. In this case, as illustrated in FIG. 9(b), the left-hand-side end portion El of the display unit 2D can be bent at the flexible portion Fl located in the left-hand-side end portion El of the display unit 2D by approximately 180 degrees towards the opposite side of the display surface.

For example, as illustrated in FIG. 10(a), it is allowable to form the flexible portion Fr in the right-hand-side end portion Er and also form the flexible portion Fl in the left-hand-side end portion El. In this case, as illustrated in FIG. 10(b), while the right-hand-side end portion Er of the display unit 2E and the left-hand-side end portion El of the display unit 2F are bonded together, both the right-hand-side end portion Er of the display unit 2A and the left-hand-side end portion El of the display unit 2B can be bent.

For example, as illustrated in FIG. 11(a), it is allowable to provide two different types of display units: the display units 2G and 2I of a first type where no flexible portion is formed in any of the left-hand-side end portion El and the right-hand-side end portion Er; and the display units 2H and 2J of a second type where the flexible portions Fl and Fr are formed respectively in the left-hand-side end portion El and the right-hand-side end portion Er. In this case, as illustrated in FIG. 11(b), the display unit 2H where the flexible portions Fl and Fr are formed respectively in the two end portions El and Er is bonded between the display units 2G and 2I where no flexible portion is formed in any of the two end portions El and Er. In addition, the display unit 2I where no flexible portion is formed any of the two end portions El and Er is bonded between the display units 2H and 2J where the flexible portions Fl and Fr are formed respectively in the two end portions El and Er.

In the case of bonding as illustrated in FIG. 11, a display body that is not flexible ("no flexible display body," for short) may be used as each of the display units 2G and 2I where no flexible portion is formed in any of the two end portions. The no flexible display body can be manufactured, for example, in a manufacturing step including all the manufacturing steps of the flexible display body (Step S1 to Step S12) but the steps for replacing the transparent support body 50 (e.g., glass substrate) with the lower face film 10 (Step S7 to Step S9). The no flexible display body tends to be manufactured through fewer manufacturing steps than the manufacturing steps needed for the flexible display body. Hence, the non-flexible display body tends to have a higher yield and a lower manufacturing cost than the flexible display body. Accordingly, use of the non-flexible display bodies as the display units 2G and 2I where no flexible portion is formed in any of the end portions helps improve the yield of the display device 1 and reduce the cost of manufacturing the display device 1.

In addition, it is also allowable to couple three or more display units 2 through any combination of various coupling ways such as ones illustrated in FIG. 5(c), FIG. 9(b), FIG. 10(b), and FIG. 11(b).

It is preferable to repeat exclusively the coupling way illustrated in FIG. 5(c), and bend only the right-hand-side end portions Er. In this case, no display unit 2 has a left-hand-side end portion El with a flexible portion formed therein, but every display unit 2 has a right-hand-side end portion Er with a flexible portion Fr formed therein. Accordingly, all the display unit 2 may have identical configurations. Alternatively, it is preferable to repeat exclusively the coupling way illustrated in FIG. 9(b) and bend only the left-hand-side end portions El. In this case, every display unit 2 has a left-hand-side end portion El with a flexible portion Fl formed therein, but no display unit 2 has a right-hand-side end portion Er with a flexible portion formed therein. Accordingly, all the display unit 2 may have identical configurations.

Figure 12:
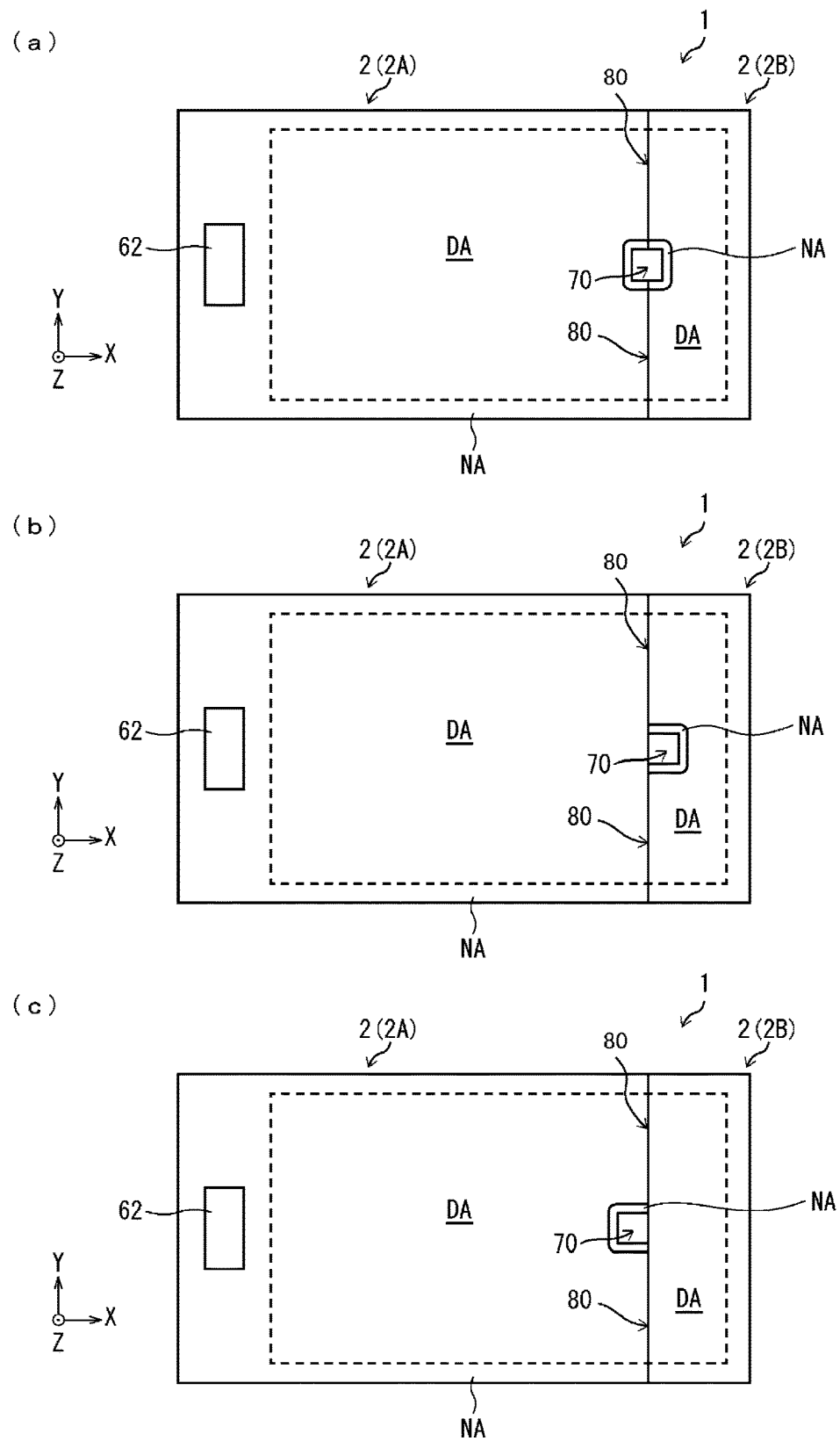
FIG. 12 is a top view illustrating a configuration of a display device according to a modified example.

FIG. 12 is a top view illustrating a configuration of a display device 1 according to other modified examples.

The display device 1 in the example of FIG. 12 is used, for example, in an electronic device such as a smartphone and a game console. The display device 1 in the example of FIG. 12 includes a display unit 2A, a display unit 2B, two bonding portions 80, a through-hole 70, a source wiring line S (not illustrated), a gate wiring line G (not illustrated), and a second drive circuit 62. Note that the display unit 2A, the display unit 2B, the bonding portions 80, the source wiring line S, the gate wiring line G, and the second drive circuit are similar to those of the first embodiment, and thus descriptions thereof will be omitted.

As illustrated in FIG. 12(a), the through-hole 70 may be formed across the display unit 2A and the display unit 2B. In this case, the display unit 2A and the display unit 2B may be provided with a first notched portion N1 and a second notched portion N2, respectively. The periphery of the through-hole 70 is surrounded by the frame region NA. Note that in the example of FIG. 12(a), the through-hole 70 has a substantially rectangle shape. The through-hole 70 may have other shapes such as a circular shape.

As illustrated in FIG. 12(b), the through-hole 70 may be formed only on the display unit 2B side. In this case, the display unit 2B may be provided with the second notched portion N2. Among the periphery of the through-hole 70, a portion included on the display unit 2B side is surrounded by the frame region NA. As illustrated in FIG. 12(c), the through-hole 70 may be formed only on the display unit 2A side. In this case, the display unit 2A may be provided with the first notched portion N1. Among the periphery of the through-hole 70, a portion included on the display unit 2A side is surrounded by the frame region NA.

For example, a camera (not illustrated), which is an image taking portion, is disposed on the back face side of the display device 1. The image taking portion is disposed to face the through-hole 70. As a result, in an electronic device such as a smartphone, the region around the image taking portion can also be used widely as display region DA. Note that the image taking portion includes a lens, a flash (light source), or the like of a camera. For example, a touch sensor, an infrared sensor, a button, a stick, or the like, which is an operation unit for operating the display device 1, may be disposed in the through-hole 70.

Figure 13:
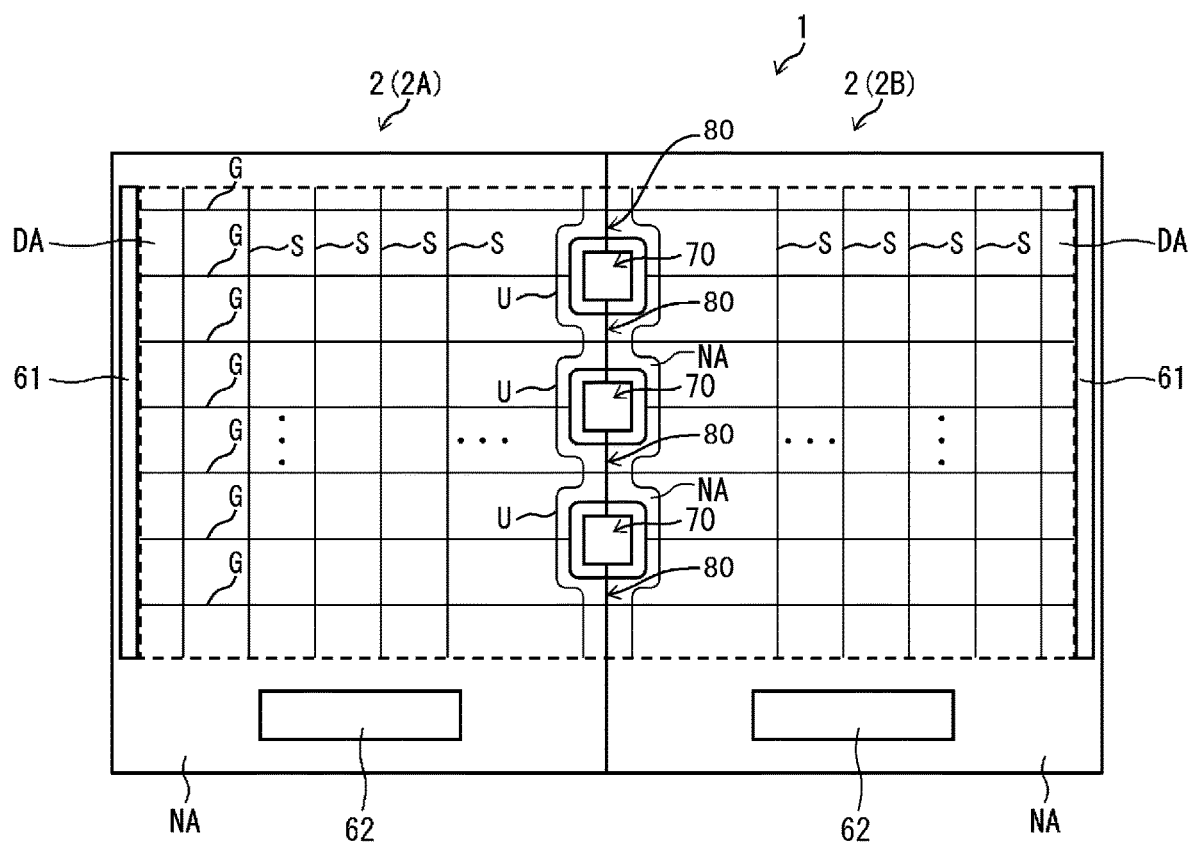
FIG. 13 is a top view illustrating a configuration of a display device according to a modified example.

FIG. 13 is a top view illustrating a configuration of a display device 1 according to another modified example.

The display device 1 in the example of FIG. 13 is used, for example, in an electronic device such as a mobile terminal. For example, above-described lens and the flash of the camera, and the operation unit, or the like are disposed in a position opposing the through-hole 70 on the back face side of the display device 1. In the display device 1, each of the display unit 2A and the display body 2B includes a gate wiring line G (gate signal line) extending in one direction, a source wiring line S (source signal line) extending in a direction intersecting the gate wiring line G, a first drive circuit 61, and a second drive circuit 62. In the bonding portion 80 of the display device 1, the gate wiring line G of the display body 2A and the gate wiring line G of the display body 2B are electrically connected to each other by mutually connected first terminal portion Tr and the second terminal portion Tl.

Specifically, in the display device 1, the display unit 2A on the left side and the display unit 2B include the first drive circuit 61 and the second drive circuit 62 in the respective frame regions NA. The first drive circuit 61 supplies a signal to the gate wiring line G. The second drive circuit 62 supplies a signal to the source wiring line S. In other words, the first drive circuit 61 supplies a signal to the gate wiring line G from the left and right in FIG. 13. The second drive circuit 62 supplies a signal to the source wiring line S from the lower side in FIG. 13. In the four bonding portions 80, the gate wiring line G of the display unit 2A and the gate wiring line G the display unit 2B are electrically connected to each other by mutually connected first terminal portion Tr (not illustrated) and the second terminal portion Tl (not illustrated). Note that the bonding portion 80 is similar to that of the above-described first embodiment, and thus description thereof will be omitted.

As illustrated in FIG. 13, the display unit 2A and the display unit 2B include a plurality of gate wiring lines G extending from the left side to the right side in the display regions DA. The display unit 2A and the display unit 2B include a plurality of source wiring lines S extending from the upper side to the lower side in the display regions DA. Note that for convenience of explanation, in FIG. 13, only a part of each of the plurality of source wiring lines S and the plurality of gate wiring lines G is illustrated. However, a large number of the source wiring lines S and the gate wiring lines G are provided to be dense within the display regions DA.

As illustrated in FIG. 13, the source wiring line S includes a bypass portion U that is wired to avoid the through-hole 70 disposed in the extending direction of the source wiring line S. In other words, the source wiring line S vertically extends while avoiding the through-hole 70. The gate wiring line G of the display unit 2A and the gate wiring line G of the display unit 2B are electrically connected to each other by the bonding portion 80 between adjacent through-holes 70. As a result, the region sandwiched between the adjacent through-holes 70 is also formed as the display region DA. The second drive circuit 62 can supply a signal to the source wiring line S from the lower side in FIG. 13. As a result, the disposing step of the second drive circuit 62 can be simplified.

As illustrated in FIG. 13, the plurality of through-holes 70 are more preferably arranged along the source wiring line S. As a result, even in a case where the through-holes are provided in the display region DA, the effect on the display can be reduced. The plurality of through-holes 70, however, may be arranged along the gate wiring line G.

Figure 14:
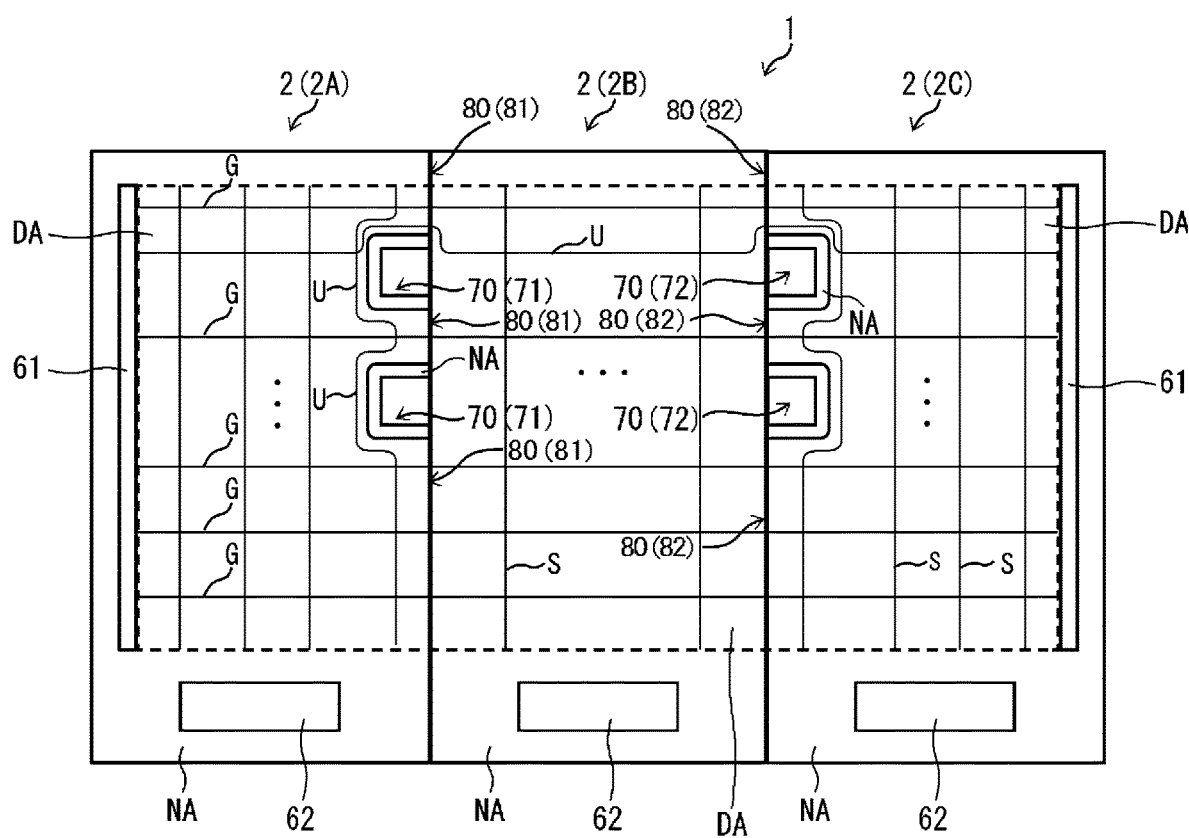
FIG. 14 is a top view illustrating a configuration of a display device according to a modified example.

FIG. 14 is a top view illustrating a configuration of a display device 1 according to another modified example.

The display device 1 in the example of FIG. 14 is used in a mobile terminal such as a smartphone and an electronic device such as a game console. For example, a lens of the camera and an operation button, or the like are disposed in a position opposing the through-hole 70 on the back face side of the display device 1. In the example of FIG. 14, the display device 1 includes a display unit 2A, a display unit 2B, a display unit 2C, a first bonding portion 81 that is the bonding portion 80, a second bonding portion 82 that is the bonding portion 80, a first through-hole 71 that is the through-hole 70, a second through-hole 72 that is the through-hole 70, a source wiring line S, a gate wiring line G, a first drive circuit 61, and a second drive circuit 62.

As illustrated in FIG. 14, in the display device 1, the display unit 2A on the left side and the display unit 2B are electrically connected to each other via three first bonding portions 81. Two first through-holes 71 sandwiched between the display unit 2A and the display unit 2B are formed between the three first bonding portions 81. The display unit 2B and the display unit 2C on the right side are electrically connected to each other via three second bonding portions 82. Two second through-holes 72 sandwiched between the display unit 2B and the display unit 2C are formed between the three second bonding portions 82. The number of the first bonding portions 81 and the second bonding portions 82, however, may be four or more, and the number of the first through-holes 71 and the second through-holes 72 may be three or more.

As illustrated in FIG. 14, the display unit 2A, the display unit 2B, and the display unit 2C include a plurality of gate wiring lines G (gate signal lines) extending from the left side to the right side in the display regions DA. The display unit 2A, the display unit 2B, and the display unit 2C include a plurality of source wiring lines S (source signal lines) extending from the upper side to the lower side in the display regions DA. Note that for convenience of explanation, in FIG. 14, only a part of each of the plurality of source wiring lines S and the plurality of gate wiring lines G is illustrated. However, a large number of the source wiring lines S and the gate wiring lines G are provided to be dense within the display regions DA.

As illustrated in FIG. 14, the two first through-holes 71 are disposed in the extending direction of the source wiring lines S. The two second through-holes 72 are disposed in the extending direction of the source wiring lines S in a row different from a row in which the two first through-holes 71 are arranged. The first through-hole 71 and the second through-hole 72 on the upper side in FIG. 14 are disposed in the extending direction of the gate wiring lines G. The first through-hole 71 and the second through-hole 72 on the lower side are disposed in the extending direction of a gate wiring line G that is different from a gate wiring line G that is wired along the first through-hole 71 and the second through-hole 72 on the upper side.

As illustrated in FIG. 14, the gate wiring line G includes a bypass portion U that is wired to avoid the first through-hole 71 and the second through-hole 72 disposed in the extending direction of the gate wiring line G. The source wiring line S includes a bypass portion U that is wired to avoid the two first through-holes 71 and the two second through-holes 72 disposed in the extending direction of the source wiring line S. In this way, even in a case where the plurality of through-holes 70 are disposed in the extending direction of the source wiring line S or the gate wiring line G, the gate wiring lines G can be electrically connected to each other in the bonding portion 80. As a result, the display region DA also can be formed in a region sandwiched between the adjacent through-holes 70.

Figure 15:
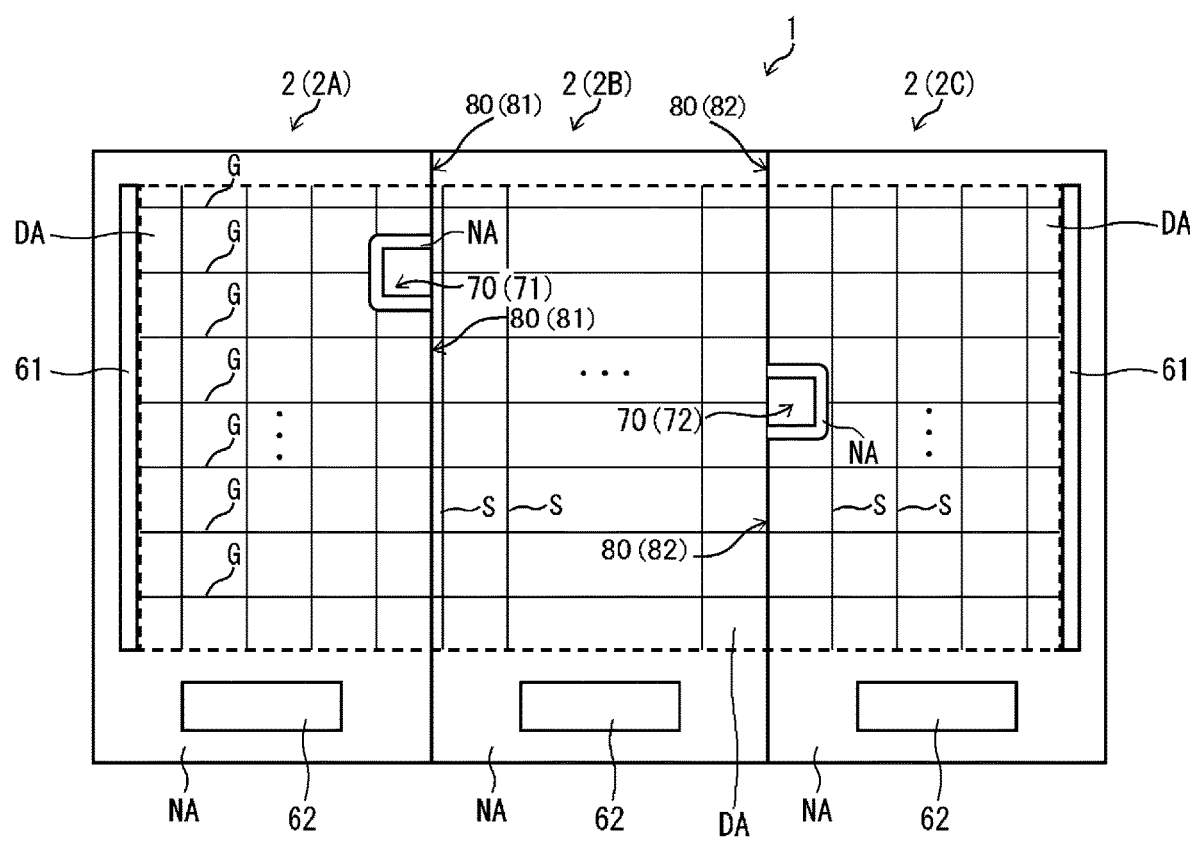
FIG. 15 is a top view illustrating a configuration of a display device according to a modified example.

FIG. 15 is a top view illustrating a configuration of a display device 1 according to another modified example.

In the display device 1 of the example of FIG. 15, one first through-hole 71 and one second through-hole 72 are provided as the through-holes 70. The direction in which the first through-hole 71 and the second through-hole 72 are arranged intersects the source wiring line S and the gate wiring line G.

The second drive circuit 62 supplies a signal to the source wiring line S from the lower side in FIG. 15. The first drive circuit 61 supplies a signal to the gate wiring line G from the left and right in FIG. 15. As a result, the signals can be supplied to the source wiring line S and/or the gate wiring line G without providing a bypass portion U. As a result, even in a case where a plurality of through-holes 70 are provided in the display regions DA in the display device 1, the wiring line pattern can be simplified and the wiring line forming step can be simplified.

Note that in the examples of FIG. 13 to FIG. 15 described above, the description is made with reference to the example of the source wiring line S. However, the source wiring line S in the examples of FIG. 13 to FIG. 15 described above may be a drain wiring line D.

Figure 16:
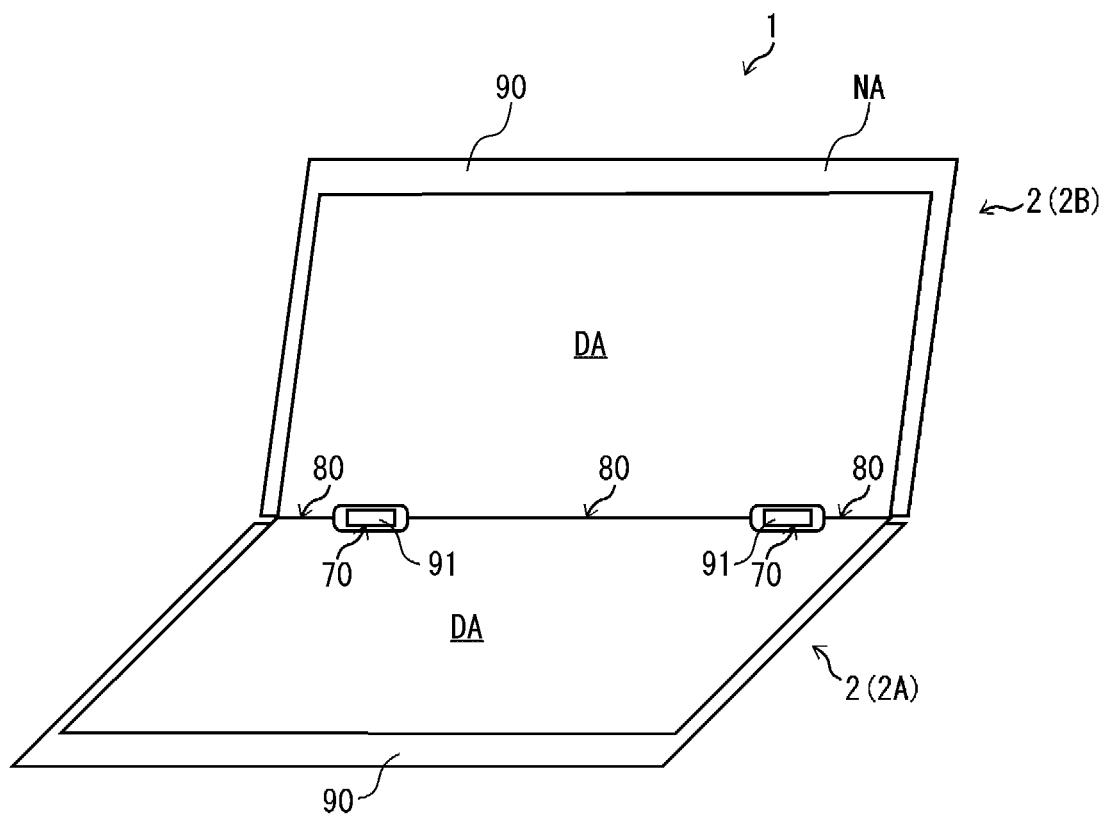
FIG. 16 is a top view illustrating a configuration of a display device according to a modified example.

FIG. 16 is a top view illustrating a configuration of a display device 1 according to another modified example.

The display device 1 in the example of FIG. 16 can be folded between the display unit 2A and the display unit 2B. The display device 1 is used, for example, in a smartphone, a notebook computer, or the like which are foldable. In the display device 1 of the example of FIG. 16, the lower display unit 2A and the upper display unit 2B are coupled together by three bonding portions 80. Each of the display unit 2A and the display unit 2B includes each of housings 90 that covers the frame region NA and the back face portion. The housings 90 of the display unit 2A and the display unit 2B are rotatably coupled together by two hinge portions 91. The two hinge portions 91 are disposed to face the through-holes 70. This makes it possible to suppress excessive bending of the bonding portion 80 even in a case where the display device 1 is folded. The region around the hinge portions 91 can also be used widely as the display region DA.

Note that the members disposed in the through-hole 70 may be other than those described in the above examples. For example, the display device 1 may be bonded to a wall or the like, and a power switch of an illumination device may be disposed in the through-hole 70. In other words, the through-hole 70 may be provided with an operation unit that operates an electronic device different from the display device 1. The display device 1 may be bonded to a structure, and a pipe, a wiring line, or the like may be passed through the through-hole 70.

2. Second Embodiment

According to the above-described first embodiment, the plurality of display units 2 are coupled together along only one direction through the bonding of each of the left-hand-side end portions El to the corresponding one of the right-hand-side end portions Er. The scope of the disclosure is not limited to such an embodiment, but the plurality of bonding portions 80 may be formed by coupling the plurality of display unit 2 together along a plurality of directions intersecting each other. Through-holes 70 sandwiched between the display units 2 coupled together along the plurality of directions intersecting each other may be formed between the plurality of bonding portions 80. The through-holes 70 and the bonding portions 80 are similar to those of above-described embodiment, and thus the description thereof will be omitted.

A display device 1 including a plurality of display unit 2 that are coupled together along two different directions of the X-axis direction (first direction) and the Y-axis direction (second direction) will be described below with reference to FIG. 17 to FIG. 25.

Figure 17:
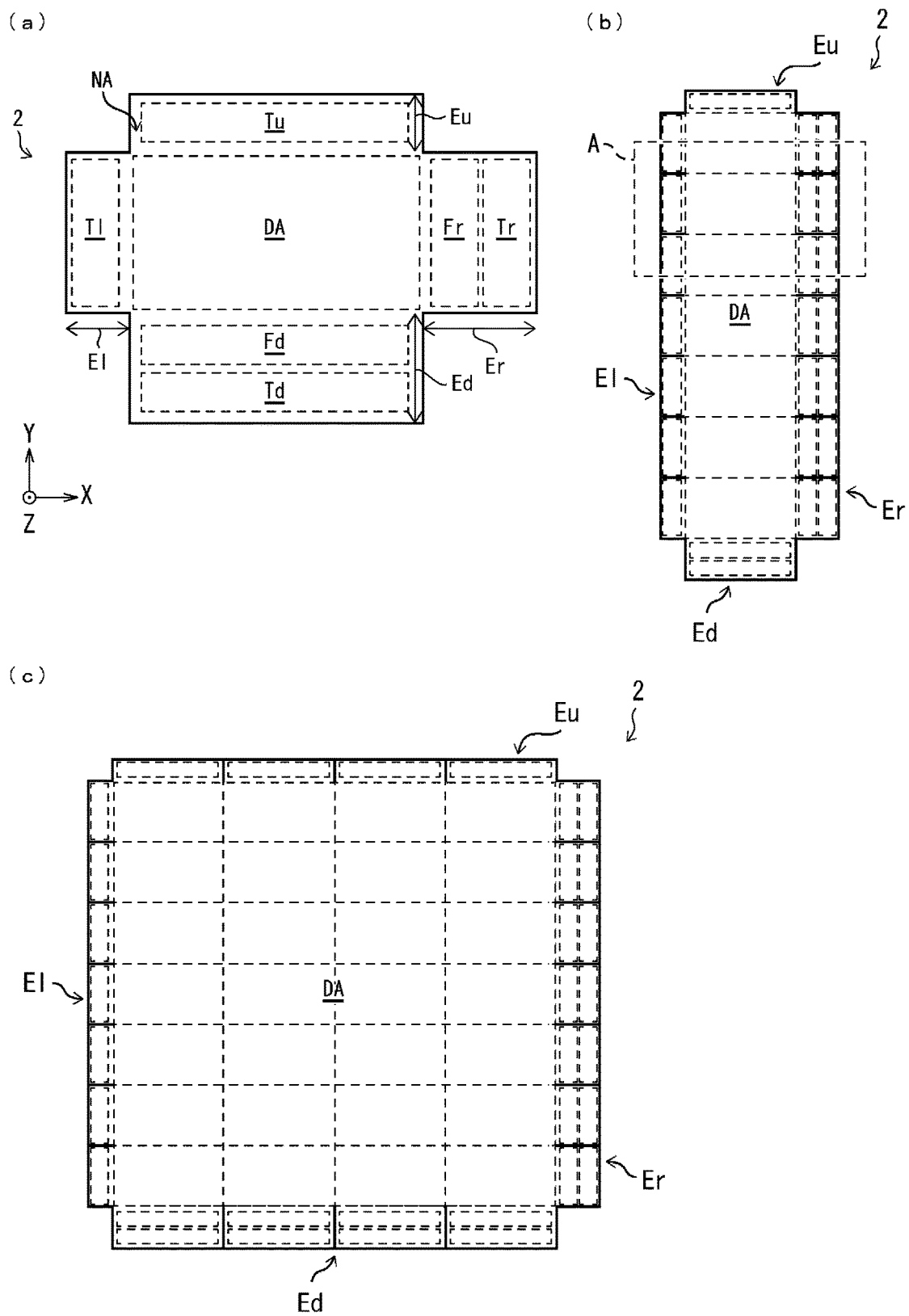
FIG. 17 is a plan view illustrating a coupling step according to a different embodiment of the disclosure.

FIG. 17 is a plan view illustrating a coupling step (S13) according to the second embodiment.

As illustrated in FIG. 17(a), the display unit 2 of the second embodiment includes a non-active area NA having: a left-hand-side end portion El on the −X side; a right-hand-side end portion Er on the +X side; an upper-side end portion Eu on the +Y side; and a lower-side end portion Ed on the −Y side.

The display unit 2 may preferably have a rectangular shape with it four corners cut away to separate the four end portions El, Er, Eu, and Ed from one another (i.e., a cross-like shape). In a case of such a shape, once the display units 2 are coupled to one another, the shape can reduce the thickness of the coupled display units 2 at and near the meeting point P of the four coupled display units 2 and thus reduce the level difference between the display surfaces of every two adjacent display units 2.

The display unit 2 has, on the −X side, the left-hand-side end portion El including a left-hand-side terminal portion Tl on whose display surface a left-hand-side terminal TMl is formed. In addition, the display unit 2 has: on the +X side, the right-hand-side end portion Er including a right-hand-side terminal TMr on whose display surface a right-hand-side terminal portion Tr is formed; and a flexible portion Fr located between an display region DA and the right-hand-side terminal portion Tr. Likewise, the display unit 2 has, on the +Y side, an upper-side end portion Eu including an upper-side terminal portion Tu on whose display surface an upper-side terminal TMu is formed. In addition, the display unit 2 has: on the −Y side, the lower-side end portion Ed including a lower-side terminal portion Td on whose display surface a lower-side terminal TMd is formed; and a flexible portion Fd located between a display region DA and the lower-side terminal portion Td.

The left-hand-side terminal TMl and the right-hand-side terminal TMr are electrically connected to one of the source wiring lines S and gate wiring lines in the active area (wiring lines extending along the X-axis direction from the left-hand-side end portion El to the right-hand-side end portion Er; i.e., first signal lines). On the other hand, the upper-side terminal TMu and the lower-side terminal TMd are electrically connected to another of the source wiring lines S and the gate wiring lines in the active area (wiring lines extending along the Y-axis direction from the upper-side end portion Eu to the lower-side end portion Ed; i.e., second signal lines).

The plurality of display units 2 are coupled together in the Y-axis direction as illustrated in FIG. 17(b), and are also coupled together in the X-axis direction as illustrated in FIG. 17(b). Alternatively, the plurality of display units 2 may be coupled together in the X-axis direction, and may also be coupled together in the Y-axis direction.

2-1. Coupling Step in Y-Axis Direction

Figure 18:
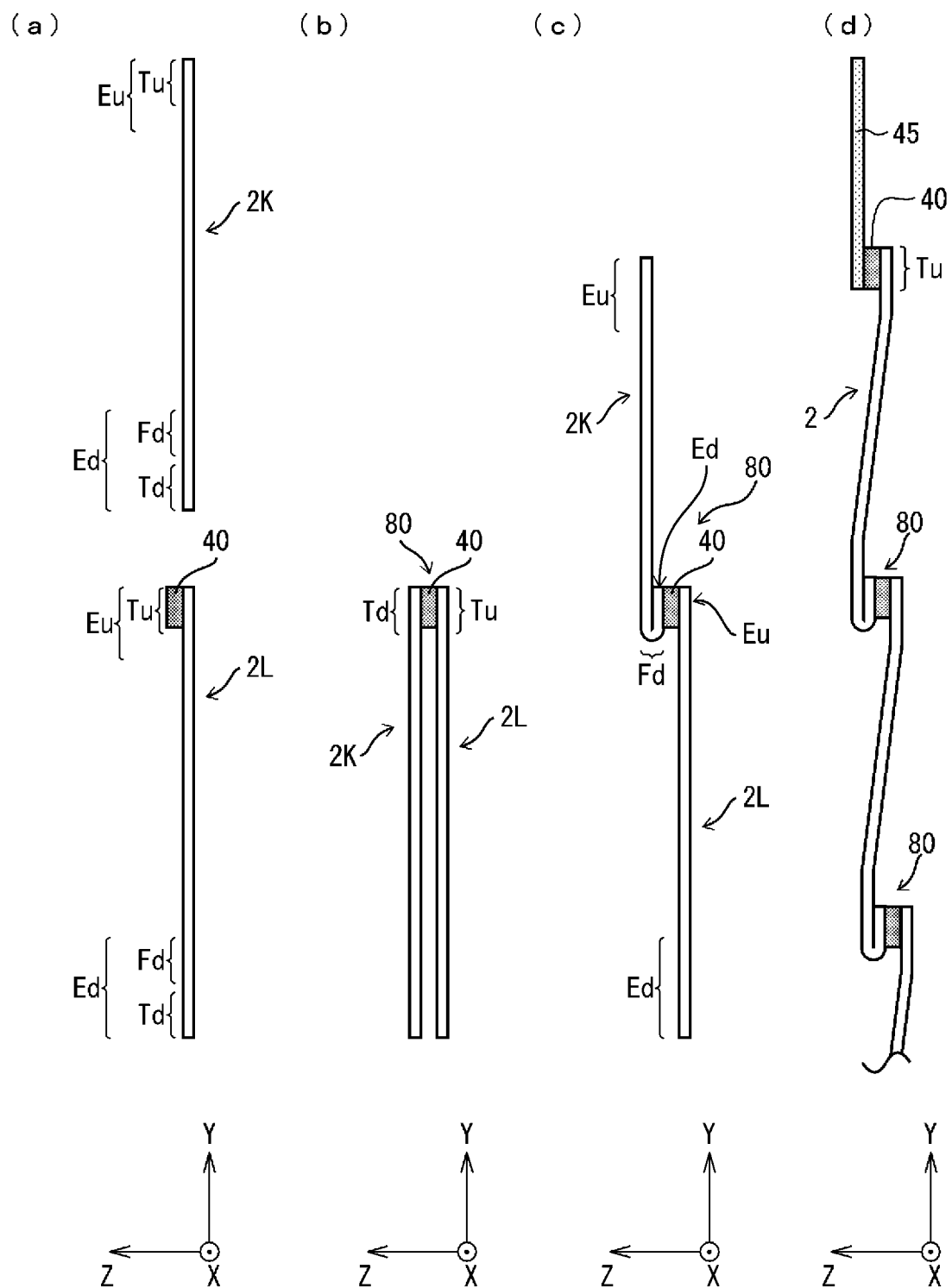
FIG. 18 is a cross-sectional view illustrating a coupling step illustrated in FIG. 17(b).

FIG. 18 is a cross-sectional view illustrating a coupling step in a Y-axis direction included in a coupling step (S13) of the second embodiment, each cross-sectional view being taken by cutting in the upper-side end portion Eu and in the lower-side end portion Ed as well as in the display region DA. Firstly, as illustrated in FIG. 18(a), a pair of display units 2 are arranged to be adjacent each other in the Y-axis direction. For convenience sake, in FIGS. 18(a) to 18(c) and in the description provided with reference to these drawings, the display unit 2 illustrated on the upper side of FIG. 18(a) is referred to as a display unit "2K," whereas the display unit 2 illustrated on the lower side of FIG. 18(a) is referred to as a display unit "2L." The pair of display units 2K and 2L may be identical display units or may not be identical display units.

Then, an anisotropic conductive film 40 is bonded to the display surface of the terminal portion Tu located in the upper-side end portion Eu of the display unit 2L (sub step of a second bonding step). Alternatively, an anisotropic conductive film 40 may be bonded to the display surface of the terminal portion Td located in the lower-side end portion Ed of the display unit 2K.

Then, as illustrated in FIG. 18(b), the display unit 2K is overlapped on the display unit 2L to allow: (i) the display surfaces of the display units 2K and 2L to face each other; and (ii) the lower-side terminal portion Td of the display unit 2K to be overlapped on the upper-side terminal portion Tu of the display unit 2L. Alternatively, the display unit 2L may be overlapped on the display unit 2K (specifically, on the display surface of the display unit 2K). Hence, the display surface of the lower-side terminal portion Td of the display unit 2K and the display surface of the upper-side terminal portion Tu of the display unit 2L face each other with the anisotropic conductive film 40 provided in between.

Then, the terminal portion Td of the display unit 2K and the terminal portion Tu of the display unit 2L are subjected to heat and pressure. As a result, the terminal portion Td of the display unit 2K and the terminal portion Tu of the display unit 2L are bonded together by means of the anisotropic conductive film 40 (sub step of the second bonding step). At the same time, the lower-side terminal TMd formed on the display surface of the terminal portion Td of the display unit 2K is connected, via the anisotropic conductive film 40, to the upper-side terminal TMu formed on the display surface of the terminal portion Tu of the display unit 2L.

Subsequently, as illustrated in FIG. 18(c), the lower-side end portion Ed of the display unit 2K is bent at the flexible portion Fd located in the lower-side end portion Ed of the display unit 2K by approximately 180 degrees towards the opposite side of the display surface (second bending step). Thus, the terminal portion Td of the display unit 2K and the terminal portion Tu of the display unit 2L that have been bonded together are hidden behind the display unit 2K from the view from the display surface side. In addition, the display surface of the display unit 2K and the display surface of the display unit 2L can be substantially flush with each other.

By repeating the above-described coupling operation, three or more display units 2 can be coupled together in the Y-axis direction.

As in the case of the left-hand-side end portion El, in a case where the upper-side end portion Eu of a particular display unit 2 is not bonded to the lower-side end portion Ed of a different display unit 2, an electronic circuit board 45 (third circuit board) may be mounted on the upper-side end portion Eu of the particular display unit 2 to allow the upper-side terminals TMu of the upper-side end portion Eu to be electrically connected to the input/output terminals of the electronic circuit board 45 (third circuit board mounting step). In addition, in a case where the lower-side end portion Ed of a particular display unit 2 is not bonded to the upper-side end portion Eu of a different display unit 2, an electronic circuit board 45 (fourth circuit board) may be mounted on the lower-side end portion Ed of the particular display unit 2 to allow the lower-side terminal TMd of the lower-side end portion El to be electrically connected to the input/output terminals of the electronic circuit board 45 (fourth circuit board mounting step). As in the case of the right-hand-side end portion Er, in a case where the lower-side end portion Ed of a particular display unit 2 is not bonded to the upper-side end portion Eu of a different display unit 2, the lower-side end portion Ed of the particular display unit 2 may be cut off (second cut-off step).

By repeating the above-described coupling operation in the Y-axis direction, three or more display units 2 can be coupled together in the Y-axis direction.

Figure 19:
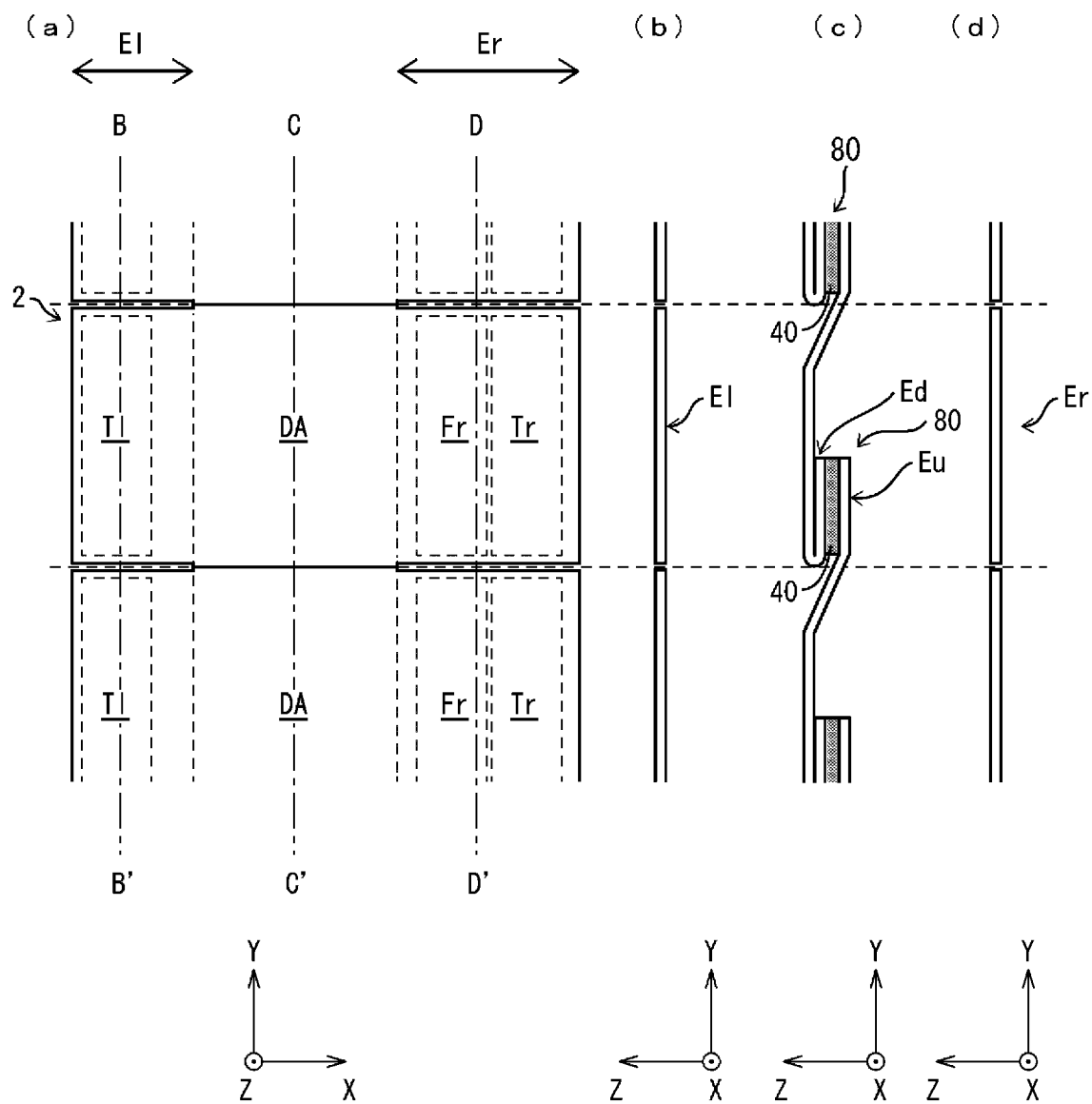
FIG. 19(a) is an enlarged view of an enclosure A illustrating a configuration example of a display unit coupled as illustrated in FIG. 17(b)
FIG. 19(b) is a cross-sectional view taken along the line B-B'.
FIG. 19(c) is a cross-sectional view taken along the line C-C'.
FIG. 19(d) is a cross-sectional view taken along the line D-D'.

FIG. 19(a) is an enlarged view of an enclosure A in FIG. 17(b) illustrating a configuration example of the display unit 2 coupled in the Y-axis direction according to the second embodiment, FIG. 19(b) is a cross-sectional view taken along the line B-B' of FIG. 19(a), FIG. 19(c) is a cross-sectional view taken along the line C-C' of FIG. 19(a), and FIG. 19(d) is a cross-sectional view taken along the line D-D' of FIG. 19(a). The B-B' cross section illustrated in FIG. 19 is a cross section taken by cutting the left-hand-side end portion El. The C-C' cross section illustrated in FIG. 19 is a cross section taken by cutting the upper-side end portion Eu, the lower-side end portion Ed, and the display region DA. The cross section D-D' illustrated in FIG. 19 is a cross section taken by cutting the right-hand-side end portion Er.

As illustrated in FIG. 19, it is preferable that when the display units 2 are coupled together in the Y-axis direction, the left-hand-side end portions El of the display units 2 that are adjacent to each other in the Y-axis direction should not be bonded together. This is because, in the case of such left-hand-side end portions El bonded together, each of the bonded portions becomes thicker than otherwise, and such thicker bonded portions create level differences in—and thus adversely affect—the display surface after the coupling in the X-axis direction. In addition, by taking a certain manufacturing error into account, it is preferable that the left-hand-side end portions El be separated from each other so as not to allow the left-hand-side end portions El to overlap each other. Likewise, it is preferable that the right-hand-side end portions Er of the display units 2 that are adjacent to each other in the Y-axis direction be not bonded together and that such right-hand-side end portions Er be separated from each other.

As illustrated in FIG. 17(d) and as in the case of the left-hand-side end portion El, in a case where the upper-side end portion Eu of a particular display unit 2 is not bonded to the lower-side end portion Ed of a different display unit 2, an electronic circuit board 45 may be mounted on the upper-side end portion Eu of the particular display unit 2 to allow the upper-side terminals TMu of the upper-side end portion Eu to be electrically connected to the input/output terminals of the electronic circuit board 45. In addition, though not illustrated and as in the case of the right-hand-side end portion Er, in a case where the lower-side end portion Ed of a particular display unit 2 is not bonded to the upper-side end portion Eu of a different display unit 2, an electronic circuit board 45 may be mounted on the lower-side end portion Ed of the particular display unit 2 to allow the lower-side terminal TMd of the lower-side end portion El to be electrically connected to the input/output terminals of the electronic circuit board 45. In addition, in a case where the lower-side end portion Ed of a particular display unit 2 is not bonded to the upper-side end portion Eu of a different display unit 2, the lower-side end portion Ed of the particular display unit 2 may be cut off.

2-2. Coupling Step in X-Axis Direction

Of the steps included in the coupling step (S13) according to the second embodiment, the coupling step in the X-axis direction is similar to its counterpart in the above-described coupling step (S13) according to the first embodiment, and thus, no more description is given below.

2-3. Display Device

FIG. 20(a) is a plan view illustrating a configuration example of the display device 1, seen from the display surface side, according to the second embodiment, and FIG. 20(b) is a plan view of the configuration example seen from the opposite side to the display surface.

Figure 20:
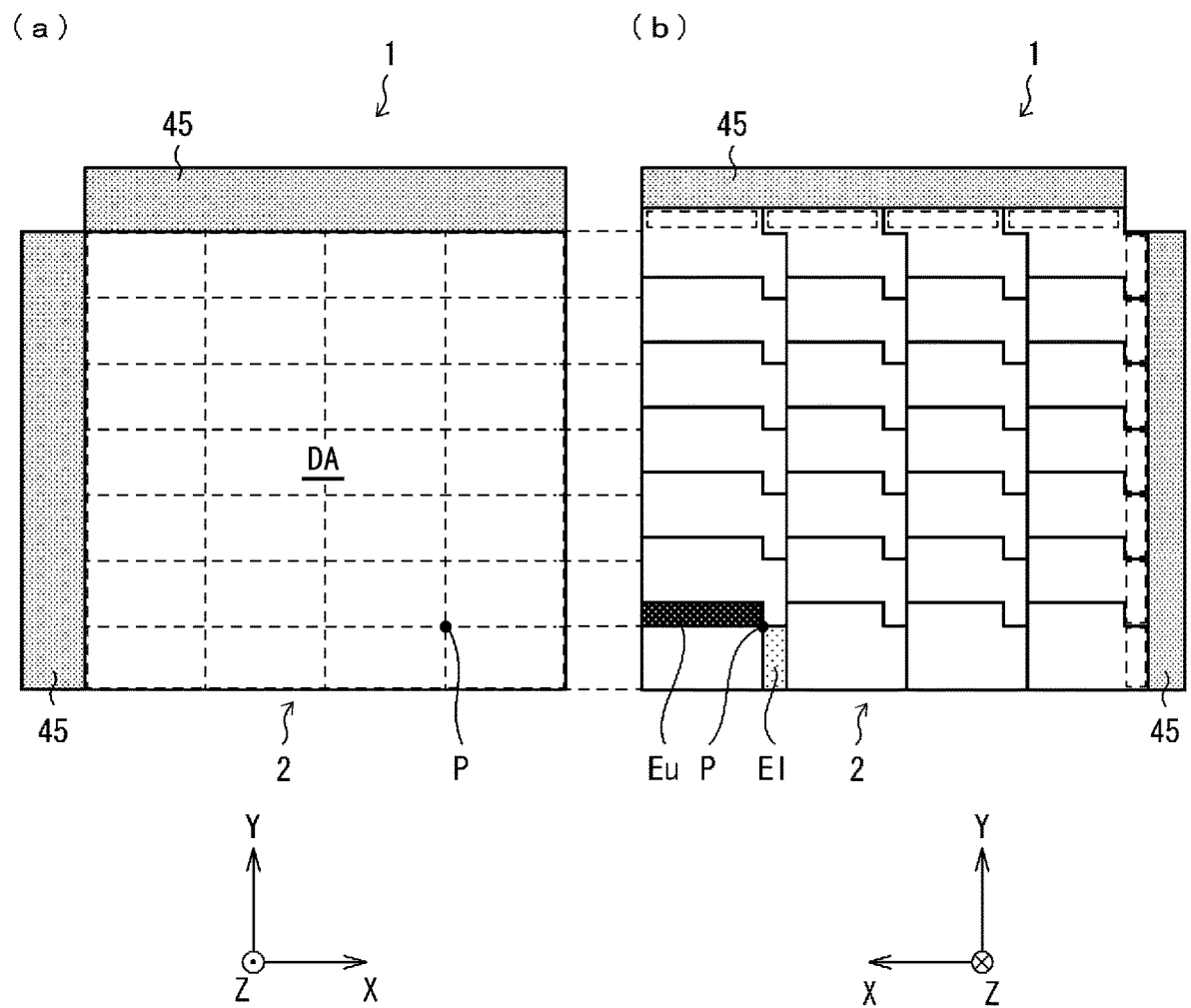
FIG. 20(a) is a plan view illustrating a configuration example of a display device 1, seen from the display surface side, according to a different embodiment of the disclosure.
FIG. 20(b) is a plan view of the configuration example seen from the opposite side to the display surface.

As illustrated in FIG. 20, the display device 1 includes a plurality of display units 2 and two electronic circuit boards 45.

One of the electronic circuit boards 45 is mounted on the left-hand-side end portion El of the leftmost display unit 2 in FIG. 20(a). The other one of the electronic circuit boards 45 is mounted on the lower-side end portions Ed of the lowermost display units 2 in FIG. 20. Hence, the two electronic circuit boards 45 are coupled to the plurality of display units 2 that are coupled to one another.

In a case of each pair of the display units 2 that are adjacent to each other in the X-axis direction, the left-hand-side end portion El of one of the display units 2 is bonded to the right-hand-side end portion Er of the other one of the display units 2. In a case of each pair of the display units 2 that are adjacent to each other in the Y-axis direction, the upper-side end portion Eu of one of the display units 2 is bonded to the lower-side end portion Ed of the other one of the display units 2. Hence, the plurality of display units are coupled together both in the X-axis direction and in the Y-axis direction.

The plurality of mutually coupled display units 2 have their respective display surfaces that are substantially flush with one another. Hence, the plurality of display regions DA of the plurality of mutually coupled display unit 2 can be visually recognized as an integrated, single active area that the display device 1 includes.

2-4. Modification Example

FIG. 21 to FIG. 24 are cross-sectional views illustrating various modifications of the coupling step in the Y-axis direction.

Figure 22:
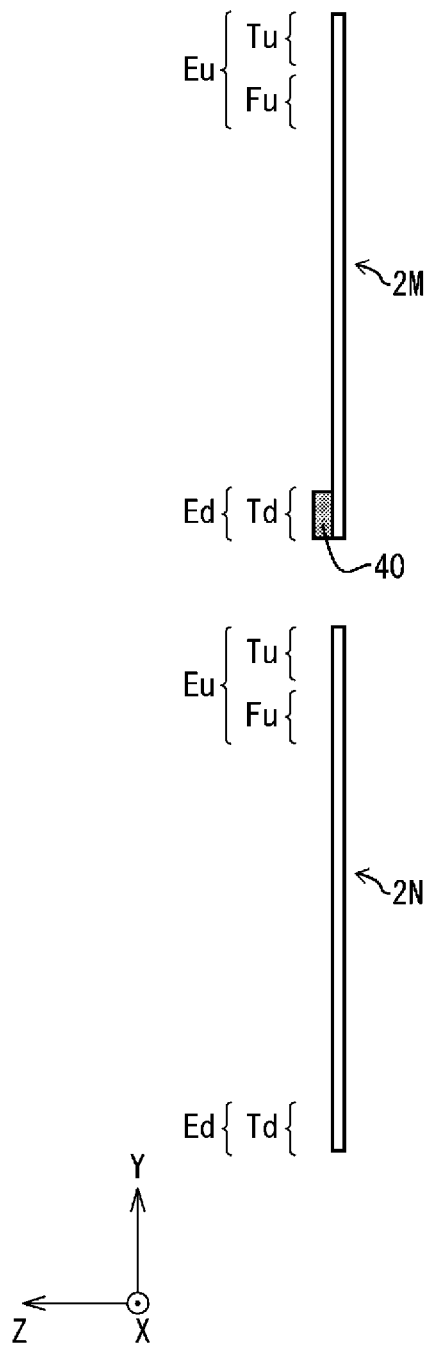
FIG. 22 is a cross-sectional view illustrating a different example of various modified examples of the coupling step illustrated in FIG. 18.
Figure 22:
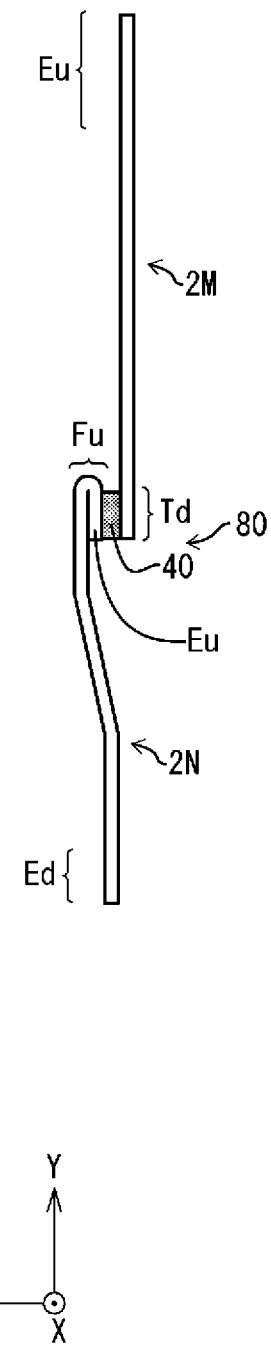
Figure 23:
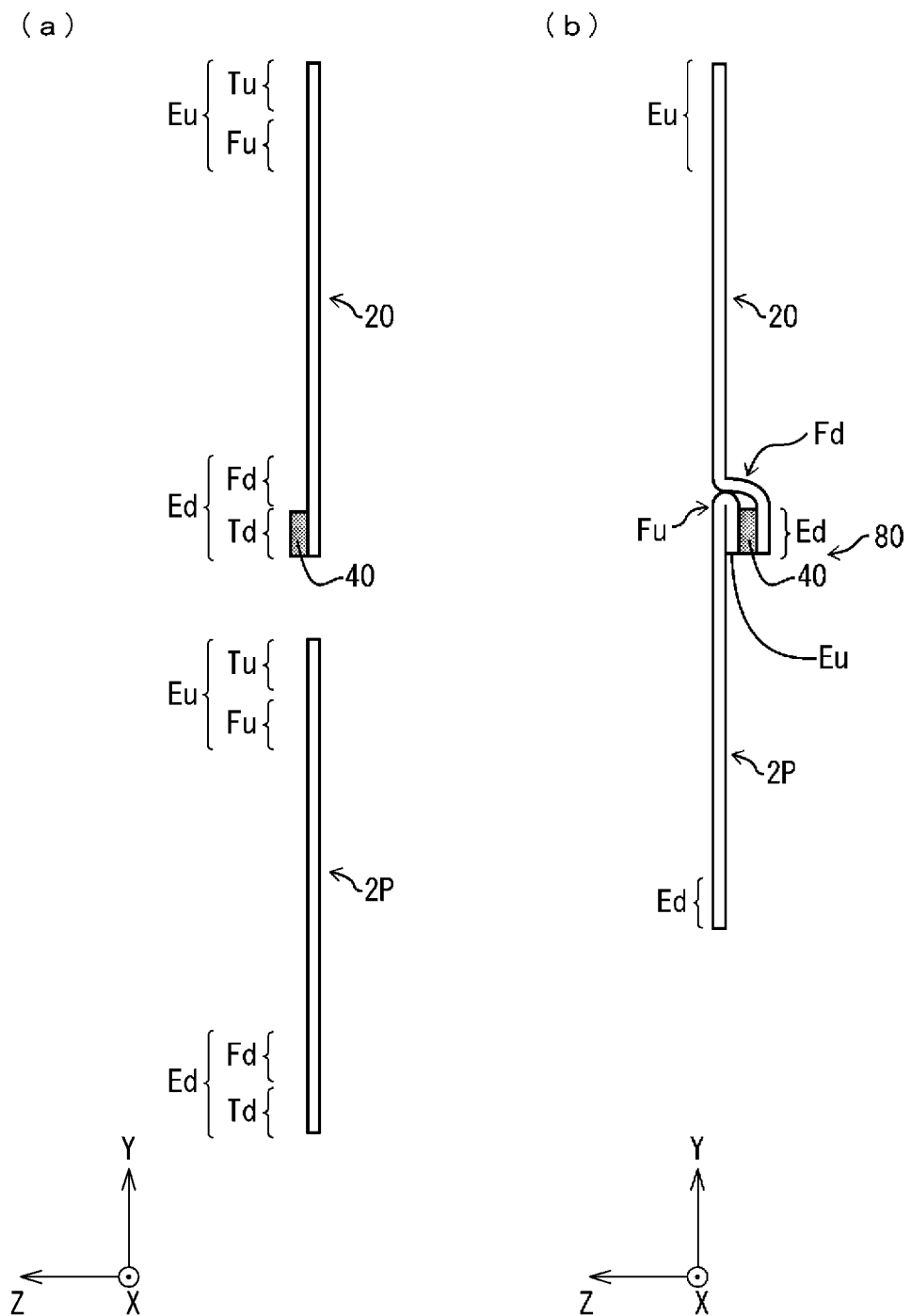
FIG. 23 is a cross-sectional view illustrating a different example of various modified examples of the coupling step illustrated in FIG. 18.
Figure 24:
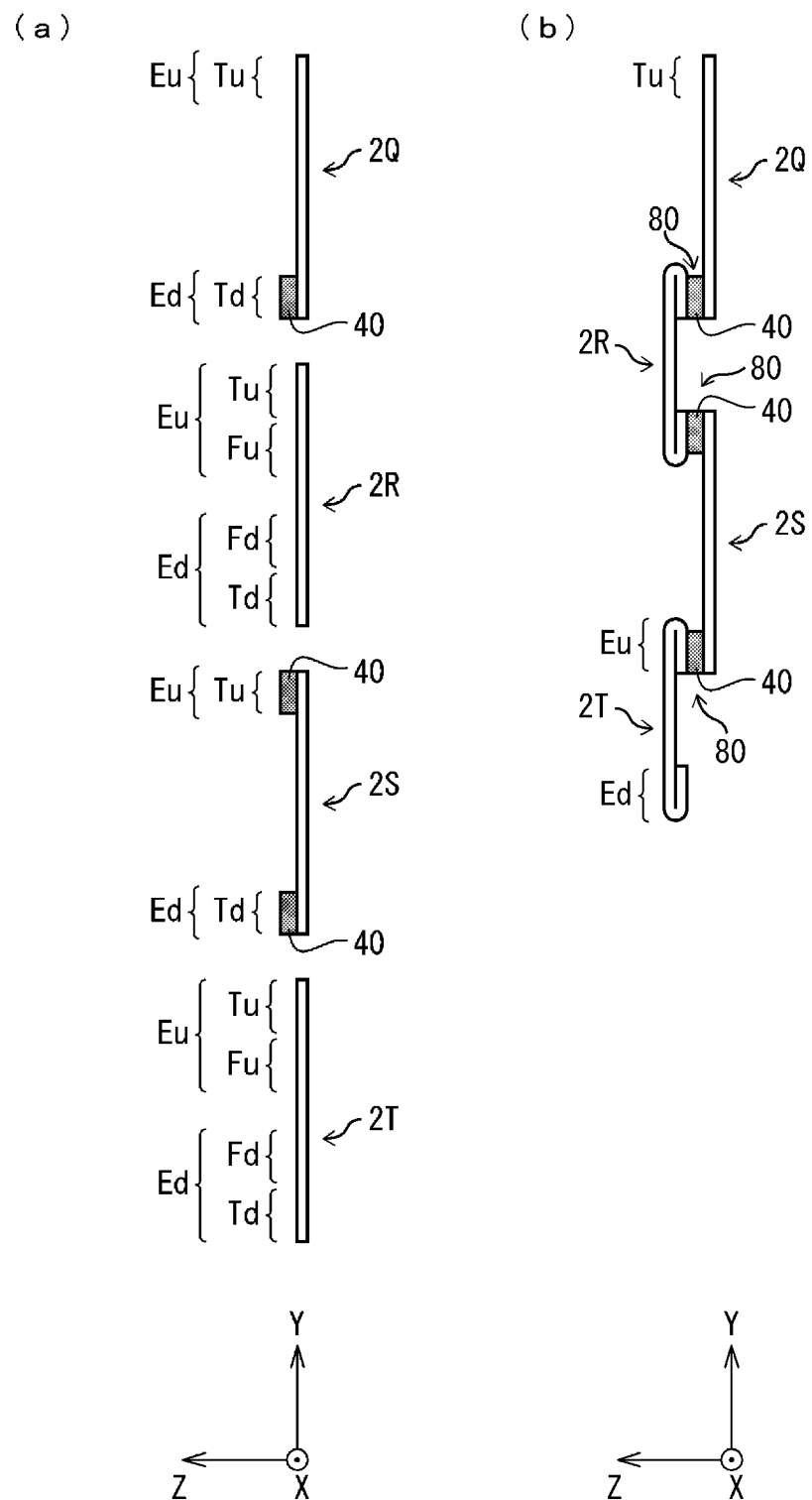
FIG. 24 is a cross-sectional view illustrating a different example of various modified examples of the coupling step illustrated in FIG. 18.

For convenience sake, in FIG. 22 and in the description provided with reference to these drawings, the display unit 2 illustrated on the upper side of FIG. 22(*a*) is referred to as a display unit "2M," whereas the display unit 2 illustrated on the lower side of FIG. 22(*a*) is referred to as a display unit "2N." In addition, in FIG. 23 and in the description provided with reference to these drawings, the display unit 2 illustrated on the upper side of FIG. 23(*a*) is referred to as a display unit "2O," whereas the display unit 2 illustrated on the lower side of FIG. 23(*a*) is referred to as a display unit "2P." In addition, in FIG. 24 and in the description provided with reference to these drawings, the uppermost display unit 2 illustrated in FIG. 24(*a*) is referred to as a display unit "2Q," the second uppermost display unit 2 illustrated in FIG. 24(*a*) is referred to as a display unit "2R," the second lowermost display unit 2 illustrated in FIG. 24(*a*) is referred to as a display unit "2S," and the lowermost display unit 2 illustrated in FIG. 24(*a*) is referred to as a display unit "2T."

Figure 21:
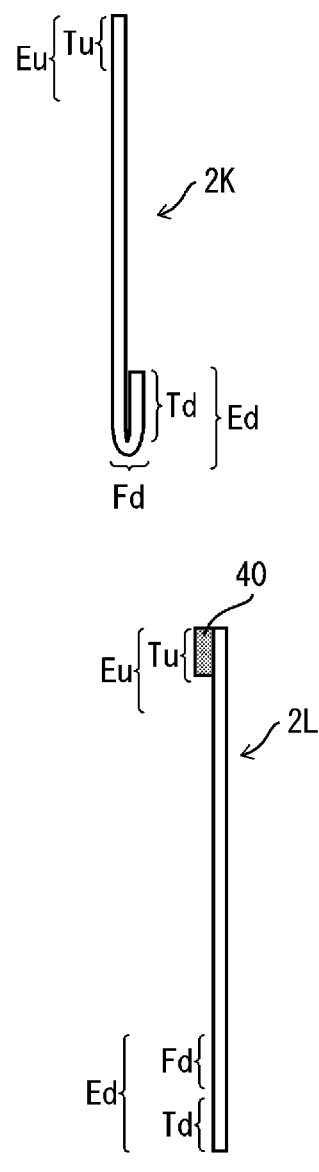
FIG. 21 is a cross-sectional view illustrating an example of various modified examples of the coupling step illustrated in FIG. 18.

For example, as illustrated in FIG. 21, prior to the mutual bonding of the adjacent pair of display units 2K and 2L, the lower-side end portion Ed of the display unit 2K may be bent at the flexible portion Fd located in the lower-side end portion Ed of the display unit 2K by approximately 180 degrees towards the opposite side of the display surface. In this case, as illustrated in FIG. 18(*c*), the terminal portion Td of the display unit 2K and the terminal portion Tu of the display unit 2L can be bonded together to allow the display surface of the terminal portion Td and the display surface of the terminal portion Tu: (i) to face and overlap each other with the anisotropic conductive film 40 provided in between; and (ii) subsequently to be bonded together via the anisotropic conductive film 40. Note that from the workability's viewpoint, it is preferable, as illustrated in FIG. 18(*b*), to bond the lower-side end portion Ed of the display unit 2K to the upper-side end portion Eu of the display unit 2L before the lower-side end portion Ed of the display unit 2K is bent.

For example, a flexible portion Fu may be formed in the upper-side end portion Eu at a position between the terminal portion Tu and the display region DA as illustrated in FIG. 22(*a*), instead of forming the flexible portion Fd in the lower-side end portion Ed. In this case, as illustrated in FIG. 22(*b*), the upper-side end portion Eu of the display unit 2L can be bent at the flexible portion Fu located in the upper-side end portion Eu of the display unit 2L by approximately 180 degrees towards the opposite side of the display surface.

For example, as illustrated in FIG. 23(*a*), it is allowable to form the flexible portion Fd in the lower-side end portion Ed and also form the flexible portion Fu in the upper-side end portion Eu. In this case, as illustrated in FIG. 23(*b*), while the lower-side end portion Ed of the display unit 2K and the upper-side end portion Eu of the display unit 2L are bonded together, both the lower-side end portion Ed of the display unit 2K and the upper-side end portion Eu of the display unit 2L can be bent.

For example, as illustrated in FIG. 24(*a*), it is allowable to provide two different types of display units: the display units 2Q and 2S of a first type where no flexible portion is formed in any of the upper-side end portion Eu and the lower-side end portion Ed; and the display units 2R and 2T of a second type where the flexible portions Fu and Fd are formed respectively in the upper-side end portion Eu and the lower-side end portion Ed. In this case, as illustrated in FIG. 24(*b*), the display unit 2R where the flexible portions Fu and Fd are formed respectively in the two end portions Eu and Ed is bonded between the display units 2Q and 2S where no flexible portion is formed in any of the two end portions Eu and Ed. In addition, the display unit 2S where no flexible portion is formed any of the two end portions Eu and Ed is bonded between the display units 2R and 2T where the flexible portions Fu and Fd are formed respectively in the two end portions Eu and Ed.

In the case of bonding as illustrated in FIG. 24, a non-flexible display body may be used as each of the display units 2Q and 2S where no flexible portion is formed in any of the two end portions as long as no flexible portion if formed any of all the end portions. Use of a non-flexible display body as each of the display units where no flexible portion is used in any of the end portions helps improve the yield of the display device 1.

In addition, it is also allowable to couple three or more display units 2 in the Y-axis direction through any combination of various coupling ways such as ones illustrated in FIG. 1(*c*), FIG. 22(*b*), FIG. 23(*b*), and FIG. 24(*b*).

It is preferable to repeat exclusively the coupling way illustrated in FIG. 18(*c*), and bend only the lower-side end portions Ed. In this case, no display unit 2 has an upper-side end portion Eu with a flexible portion formed therein, but every display unit 2 has a lower-side end portion Ed with a flexible portion Fd formed therein. Accordingly, all the display unit 2 may have identical configurations. Alternatively, it is preferable to repeat exclusively the coupling way illustrated in FIG. 22(*b*) and bend only the right-hand-side end portions Er. In this case, every display unit 2 has an upper-side end portion Eu with a flexible portion Fu formed therein, but no display unit 2 has a lower-side end portion Ed with a flexible portion formed therein. Accordingly, all the display unit 2 may have identical configurations.

Figure 25:
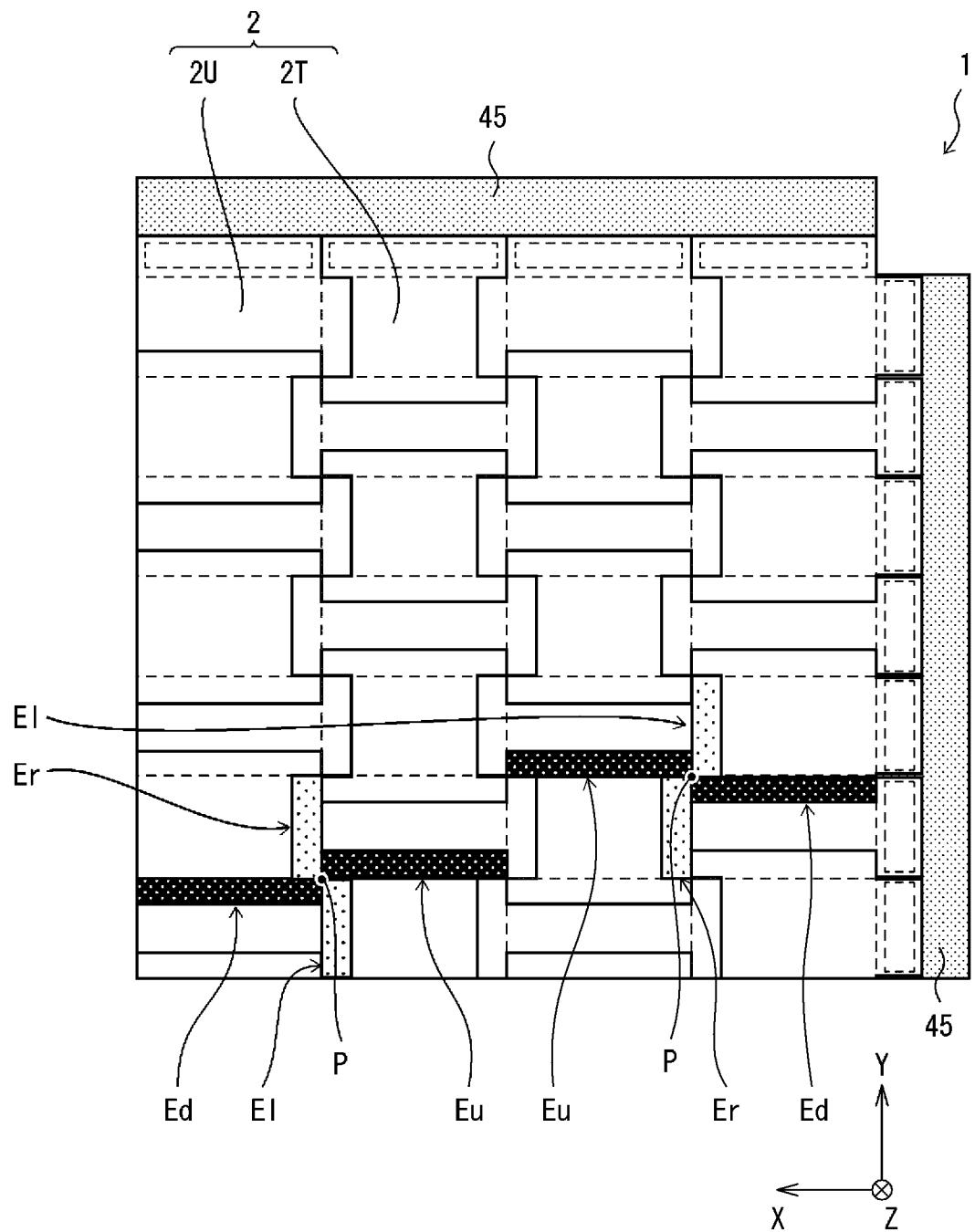
FIG. 25 is a plan view illustrating an example of combination of couplings, seen from the opposite side to the display surface, according to some embodiments of the disclosure.

It is preferable that the end portions El, Er, Eu, and Ed be bent as illustrated in FIG. 25 to allow no two mutually bonded end portions around a certain meeting point P to overlap each other.

Figure 26:
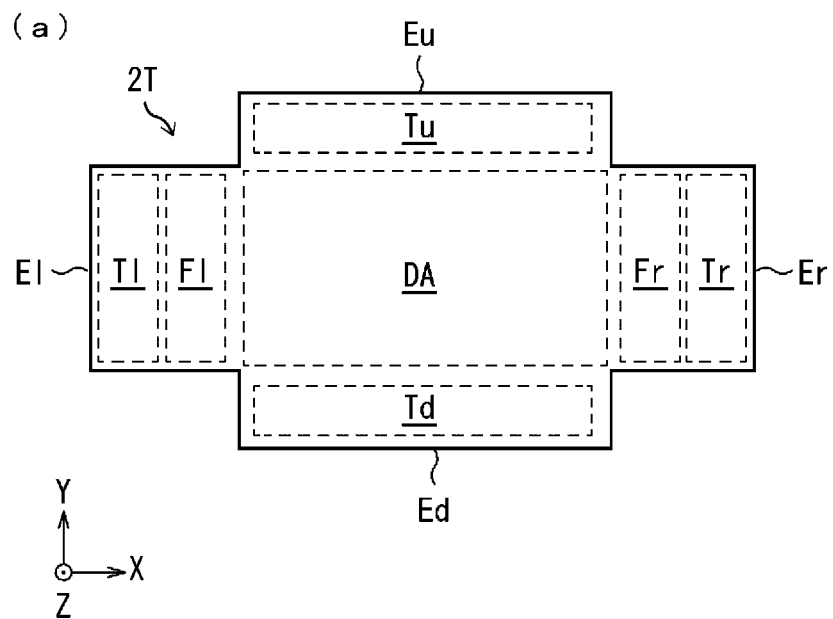
FIG. 26(a) is a plan view illustrating a general configuration of a first-type display unit illustrated as coupled in FIG. 25.
FIG. 26(b) is a plan view illustrating a general configuration of a second-type display unit illustrated as coupled in FIG. 25.
Figure 26:
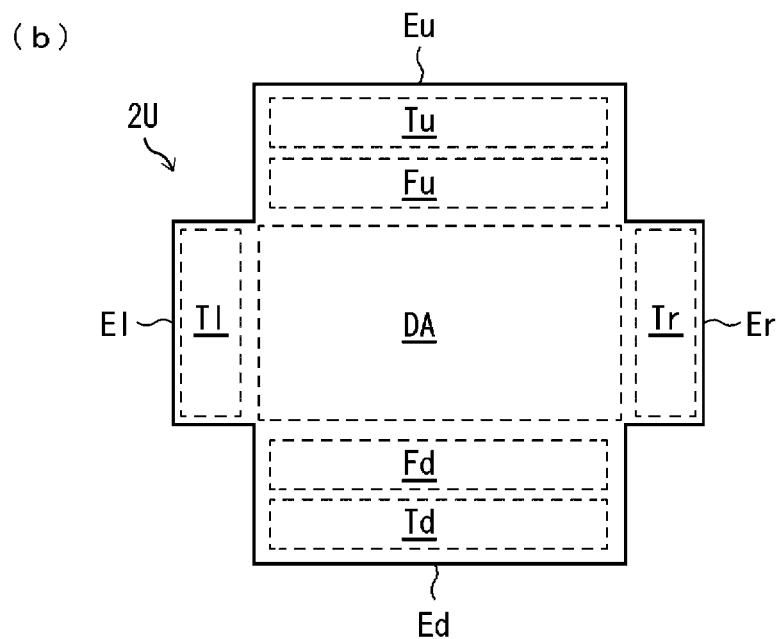

FIG. 25 is a plan view illustrating, seen from the opposite side to the display surface, an exemplar combination of the coupling in the X-axis direction and the coupling in the Y-axis direction. FIG. 26(*a*) is a plan view illustrating a general configuration of a first-type display unit 2T illustrated as coupled in FIG. 25, and FIG. 26(*b*) is a plan view illustrating a general configuration of a second-type display unit 2U illustrated as coupled in FIG. 25.

The plurality of display units 2 illustrated in FIG. 25 include two types of display units 2: a plurality of first-type display units 2T (first-type flexible display bodies) and a plurality of second-type display units 2U (second-type flexible display bodies). The first-type display unit 2T has a left-hand-side end portion El with a flexible portion Fl and a right-hand-side end portion Er with a flexible portion Fr. The first-type display unit 2T, however, has neither any upper-side end portion Eu with a flexible portion nor any lower-side end portion Ed with a flexible portion. The second-type display unit 2U has neither any left-hand-side end portion El with a flexible portion nor any right-handside end portion Er with a flexible portion. The second-type display unit 2U, however, has an upper-side end portion Eu with a flexible portion Fu and a lower-side end portion Ed with a flexible portion Fd.

The first-type display units 2T and the second-type display units 2U are coupled to one another both in the X-axis direction and in the Y-axis direction. Hence, the left-hand-side end portion El of each first-type display unit 2T is boned to the right-hand-side end portion Er of the corresponding second-type display unit 2U, and is bent. In addition, the right-hand-side end portion Er of each first-type display unit 2T is boned to the left-hand-side end portion El of the corresponding different second-type display unit 2U, and is bent. In addition, the upper-side end portion Eu of each second-type display unit 2U is boned to the lower-side end portion Ed of the corresponding first-type display unit 2T, and is bent. In addition, the lower-side end portion Ed of each second-type display unit 2U is boned to the upper-side end portion Eu of the corresponding different first-type display unit 2T, and is bent. Such couplings can be accomplished by, for example a combination of the coupling in the X-axis direction as illustrated in FIG. 11 and the coupling in the Y-axis direction as illustrated in FIG. 24.

The above-described couplings cause the end portions El, Er, Eu, and Ed that meet at each meeting point P to fall down in the same rotational direction about each meeting point P (i.e., every end portion rotates clockwise or counterclockwise). In addition, the rotational direction in which the end portions El, Er, Eu, and Ed fall down about a particular meeting point P is opposite to the rotational direction in which the corresponding end portions El, Er, Eu, and Ed fall down about a different meeting point P that is adjacent to the particular meeting point P (i.e., in a reversal rotational direction). Hence, each bonded end portion does not overlap a different bonded end portion. Accordingly, the bonded display unit 2 can have a reduced thickness and a reduced level difference between the display surfaces.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in the embodiments.

The invention claimed is:

1. A display device comprising:
a plurality of display bodies coupled together in a manner that display surfaces of display regions of the plurality of display bodies face the same direction,
wherein each of the plurality of display bodies includes the display region, a frame region surrounding the display region, and a terminal region in the frame region,
a surface formed with the terminal region is a first face, the plurality of display bodies include a first display body and a second display body,
the display region of the first display body is provided with a first notched portion,
either one of a first notched frame region provided with the first notched portion in the frame region of the first display body and a second notched frame region provided with a second notched portion in the frame region of the second display body is folded back to form a bonding portion by the first face of the first notched frame region and the first face of the second notched frame region, and
the first notched portion and the second notched portion form a through-hole of the display device.

2. The display device according to claim 1,
wherein the first face of the first notched frame region and the first face of the second notched frame region are bonded together in a manner that the first notched portion and the second notched portion face each other, and
the first notched portion and the second notched portion form one through-hole.

3. The display device according to claim 1,
wherein at least one first notched portion is provided in the display region of the first display body,
at least one second notched portion is provided in the display region of the second display body,
either one of the first notched frame region and the second notched frame region is folded back to bond the first face of the first notched frame region and the first face of the second notched frame region together, and
the at least one first notched portion and the at least one second notched portion form a plurality of the through-holes.

4. The display device according to claim 1,
wherein the terminal region includes
a first terminal region provided in the first notched frame region and provided with a plurality of first terminals and
a second terminal region provided in the second notched frame region and provided with a plurality of second terminals,
either one of the first terminal region and the second terminal region is folded back, and
the first terminal region and the second terminal region are bonded together in a manner that each of the plurality of first terminals and each of the plurality of second terminals to be electrically connected to each other.

5. The display device according to claim 4,
wherein either one of a source signal line and a gate signal line of the display device is electrically connected to each of the plurality of first terminals and each of the plurality of second terminals being electrically connected to each other.

6. The display device according to claim 4,
wherein the source signal line or the gate signal line of the first display body electrically connected to each of the plurality of first terminals is routed along the first notched portion to bypass the first notched portion.

7. The display device according to claim 6,
wherein the source signal line or the gate signal line of the second display body electrically connected to each of the plurality of second terminals is routed along the second notched portion to bypass the second notched portion.

8. The display device according to claim 5,
wherein each of the plurality of display bodies includes
the gate signal line extending in one direction in the display region and
the source signal line extending in a direction intersecting the gate signal line,
the first terminal region and the second terminal region are bonded together in the bonding portion in a manner that each of the plurality of first terminals and each of the plurality of second terminals are electrically connected to each other, and the gate signal lines of the plurality of display bodies or the source signal lines of the plurality of display bodies are electrically connected to each other.

9. The display device according to claim 5, wherein the frame region of the first display body excluding the first notched frame region and the frame region of the second display body excluding the second notched frame region are provide with a first drive circuit configured to supply a signal to the gate signal line.

10. The display device according to claim 9, wherein the first drive circuit of the first display body and the first drive circuit of the second display body are electrically connected to each other in the bonding portion.

11. The display device according to claim 5, wherein the frame region of the first display body excluding the first notched frame region and the frame region of the second display body excluding the second notched frame region include a second drive circuit configured to supply a signal to the source signal line.

12. The display device according to claim 11, wherein the second drive circuit of the first display body and the second drive circuit of the second display body are electrically connected to each other in the bonding portion.

13. The display device according to claim 8, wherein a plurality of the through-holes is provided, and at least some of the plurality of through-holes are provided along an extending direction of the source signal line.

14. The display device according to claim 8, wherein a plurality of the through-holes is provided, and at least some of the plurality of through-holes are provided along an extending direction of the gate signal line.

15. The display device according to claim 8, wherein a plurality of the through-holes is disposed, and an arrangement direction of two through-holes out of the plurality of through-holes intersects the gate signal line and the source signal line.

16. The display device according to claim 1, wherein at least one of the plurality of display bodies is a flexible display body, and a bendable flexible portion is provided between the terminal region and the display region in the frame region of each of the display bodies.

17. The display device according to claim 1, wherein the first face of the first display body and the display surface of the first display body face in the same direction.

18. The display device according to claim 1, wherein the first face of the first display body and the display surface of the first display body face in the opposite direction.

19. The display device according to claim 1, wherein either one of the first notched frame region and the second notched frame region is folded back by 90 degrees or more.

20. The display device according to claim 1, wherein either one of the first notched frame region and the second notched frame region is folded back by 180 degrees to form a planer surface.

* * * * *